(12) United States Patent
Fujimoto

(10) Patent No.: US 9,621,858 B2
(45) Date of Patent: Apr. 11, 2017

(54) SUBSTRATE WORKING DEVICE

(75) Inventor: Takeshi Fujimoto, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 488 days.

(21) Appl. No.: 14/361,207

(22) PCT Filed: Aug. 31, 2012

(86) PCT No.: PCT/JP2012/005548
§ 371 (c)(1),
(2), (4) Date: May 28, 2014

(87) PCT Pub. No.: WO2013/084383
PCT Pub. Date: Jun. 13, 2013

(65) Prior Publication Data
US 2014/0347468 A1 Nov. 27, 2014

(30) Foreign Application Priority Data

Dec. 6, 2011 (JP) .................. 2011-266991

(51) Int. Cl.
H04N 7/18 (2006.01)
H05K 13/08 (2006.01)
(Continued)

(52) U.S. Cl.
CPC ......... H04N 7/183 (2013.01); H05K 13/0061 (2013.01); H05K 13/0465 (2013.01); H05K 13/08 (2013.01); H05K 3/3484 (2013.01)

(58) Field of Classification Search
None
See application file for complete search history.

(56) References Cited

U.S. PATENT DOCUMENTS

2010/0242755 A1* 9/2010 Nagao .................. B41F 15/08
101/126
2010/0313773 A1 12/2010 Naoi et al.

FOREIGN PATENT DOCUMENTS

CN 1704859 A 12/2005
CN 101277604 A 10/2008
(Continued)

OTHER PUBLICATIONS

International Search Report; PCT/JP2012/005548; Oct. 16, 2012.
(Continued)

Primary Examiner — Dakshesh Parikh
(74) Attorney, Agent, or Firm — Studebaker & Brackett PC

(57) ABSTRACT

A substrate working device includes: a base; a first substrate working table and a second substrate working table movably supported on the base; an indicator provided to one of a base side member, which is formed on the base or a member fixed to the base, and the first and second substrate working tables; an imaging unit provided on the other one, which is different from the one, of the base side member and the first and second substrate working tables in order to image the indicator; and a control unit that, by causing the imaging unit to image the indicator and based on image data thereof, acquires position information related to each of the substrate working tables and that moreover determines whether or not the respective substrate working tables interfere with each other at the time of movement of each substrate working table based on the position information.

9 Claims, 21 Drawing Sheets

(51) Int. Cl.
*H05K 13/00* (2006.01)
*H05K 13/04* (2006.01)
*H05K 3/34* (2006.01)

(56) References Cited

FOREIGN PATENT DOCUMENTS

| | | |
|---|---|---|
| JP | 2009-070867 A | 4/2009 |
| JP | 2010-177476 A | 8/2010 |
| JP | 2011-131488 A | 7/2011 |
| JP | 2011-143640 A | 7/2011 |

OTHER PUBLICATIONS

The extended European Search Report issued by the European Patent Office on Oct. 30, 2015, which corresponds to European Patent Applicaton No. 12855398.9-1905 and is related to U.S. Appl No. 14/361,207.
An Office Action issued by the Chinese Patent Office on Jun. 2, 2016, which corresponds to Chinese Patent Application No. 201280059273.2 and is related to U.S Appl. No. 14/361,207.

\* cited by examiner

SUBSTRATE WORKING DEVICE

CROSS REFERENCE TO RELATED APPLICATIONS

This application claims benefit of priority to Japanese Patent Application 2011-266991 filed on Dec. 6, 2011, and to International Patent Application No. PCT/JP2012/005548 filed on Aug. 31, 2012, the entire content of each of which is incorporated herein by reference.

TECHNICAL FIELD

The present technical field relates to a substrate working device, and particularly relates to a substrate working device including a plurality of substrate working tables.

BACKGROUND

Conventionally, a substrate working device including a plurality of substrate working tables has been known (for example, Japanese Patent Application Laid-open No. 2009-70867).

Japanese Patent Application Laid-open No. 2009-70867 discloses a printing device (substrate working device) including two substrate working tables and two printing work units, wherein a solder paste is printed, via a mask, on a substrate held by the substrate working table. The printing device includes two substrate working tables aligned in the depth direction orthogonal to the substrate feed direction (lateral direction). The substrate working tables are movable in the depth direction separately by threaded shaft driving. The substrate working tables respectively receive a substrate from the upstream side of the feed direction, and, after solder printing work by the printing work unit, carries the printed substrate out of the substrate working table in an exit position (middle portion in the depth direction) between the two substrate working tables. The printing device performs printing work with respect to a substrate held by each substrate working table in parallel, and performs substrate discharging alternately from each substrate working table in the exit position.

In the conventional printing device, there are cases where the two substrate working tables approach each other in the depth direction, such as in the case where a substrate is discharged in the exit position. Therefore, it is necessary to program the operation of each substrate working table in advance such that the respective substrate working tables do not interfere with each other. However, in reality, there are cases where a position displacement occurs due to thermal expansion of the threaded shaft for driving the substrate working table or a coordinate value of a drive motor (coordinate value used for operation control of the substrate working table) differs from the actual position due to assembly error or the like in each unit of the substrate working table. In such cases, there is a possibility that the two substrate working tables mutually interfere.

Japanese Patent Application Laid-open No. 2009-70867 does not disclose anything about such mutual interference of the substrate working tables, and there is a problem that whether or not the two substrate working tables mutually interfere cannot be determined accurately.

SUMMARY

An object of the present disclosure is to provide a substrate working device capable of accurately determining whether or not substrate working tables mutually interfere.

A substrate working device according to one aspect of the present disclosure is a substrate working device that performs predetermined work with respect to a substrate, including: a base; a first substrate working table and a second substrate working table movably supported on the base to be able to approach each other in a specific direction; an indicator provided to one of a base side member, which is formed of the base or a member fixed to the base, and the first and second substrate working tables; an imaging unit provided on the other one, which is different from the one, of the base side member and the first and second substrate working tables, in order to image the indicator; and a control unit that, by causing the imaging unit to image the indicator and based on image data thereof and position data of one of the indicator and the imaging unit, the one which is provided to the base side member, acquires position information related to each of the substrate working tables, and that moreover determines whether or not the respective substrate working tables interfere with each other at a time of movement of each of the substrate working tables based on the position information.

DETAILED DESCRIPTION

Embodiments of the present disclosure will be described below based on the drawings.

First Embodiment

First, referring to FIG. 1 to FIG. 8, the structure of a printing device 100 according to a first embodiment of the present disclosure will be described. In the first embodiment, an example of applying a "substrate working device" of the present disclosure to the printing device 100 will be described.

Figure 1:
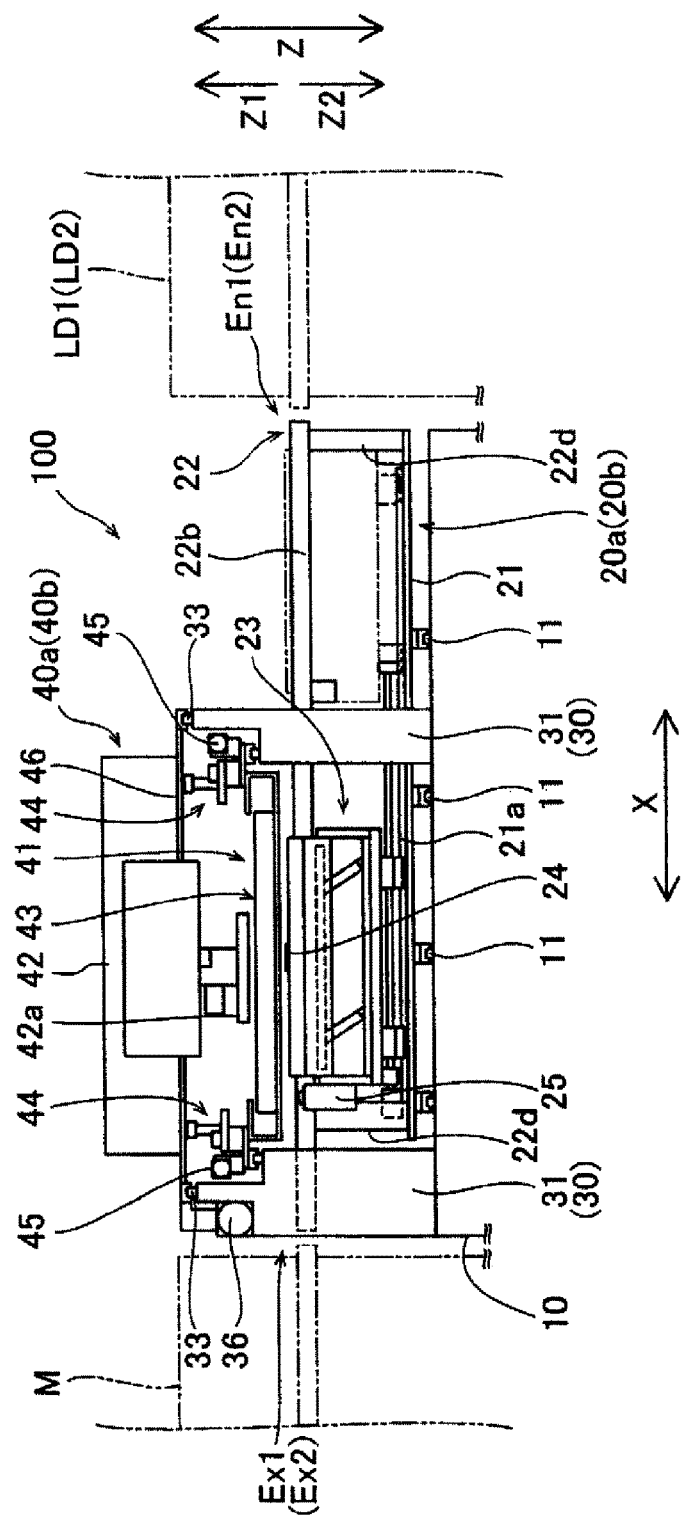
FIG. 1 is a side view of a printing device according to a first embodiment of the present disclosure when seen from the Y-direction.
Figure 2:
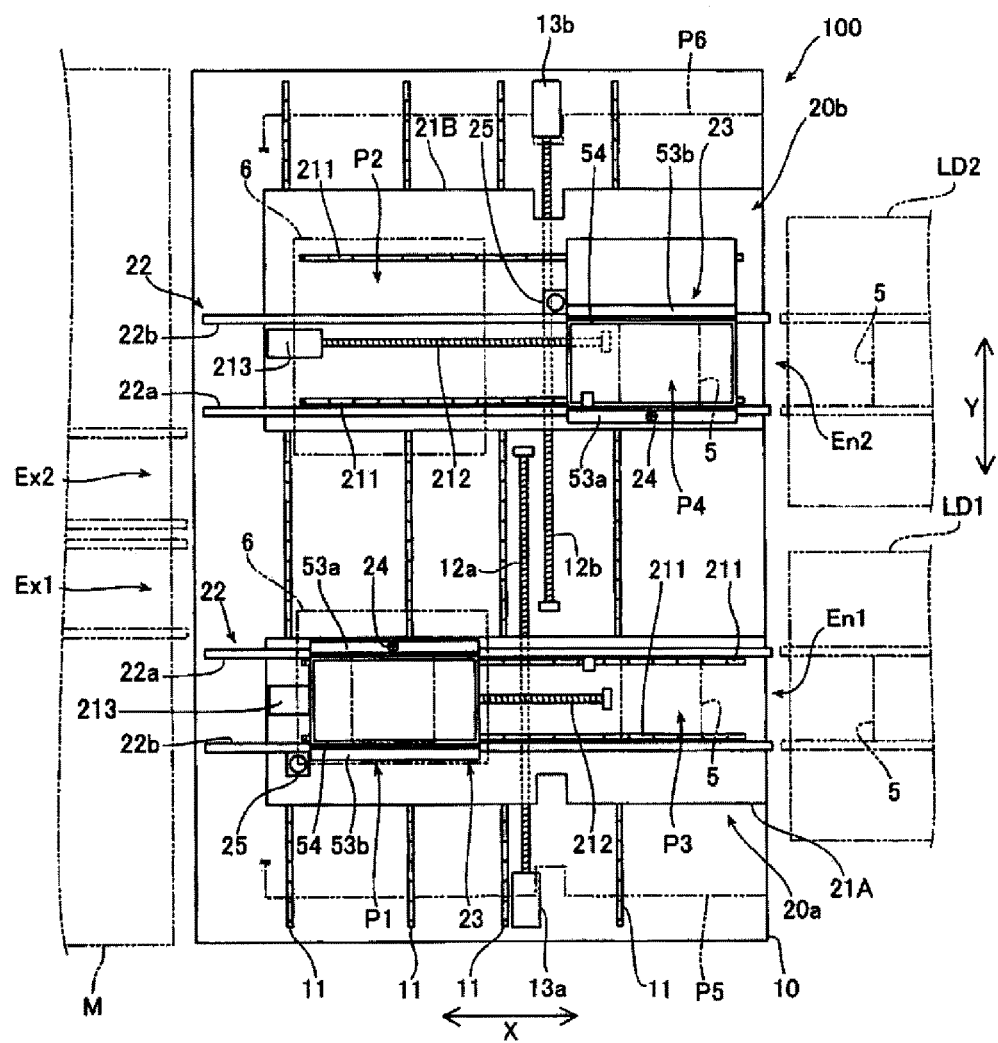
FIG. 2 is a plan view showing the configuration and arrangement of a substrate working table of the printing device according to the first embodiment of the present disclosure.

As shown in FIG. 1 and FIG. 2, the printing device 100 according to the first embodiment of the present disclosure performs mask printing of a solder paste on the upper surface of a print substrate (wiring substrate) 5 fed into the body of the device. The print substrate 5 is one example of a "substrate" of the present disclosure.

The printing device 100 accepts the print substrate 5 in entrance positions En1 and En2 on the upstream side of the feed direction (right side in the X-direction) respectively from two loaders LD1 and LD2, performs printing on the print substrate 5 in printing positions P1 and P2, and discharges the printed print substrate 5 from exit positions Ex1 and Ex2 on the downstream side of the feed direction (left side in the X-direction) to a dual-feed surface mounting machine M on the downstream side. The exit positions Ex1 and Ex2 are arranged on the inside in the Y-direction relative to the two entrance positions En1 and En2 to correspond to two substrate feed lines of the surface mounting machine M.

In this example, the feed direction of the print substrate 5 is the X-direction, and a direction orthogonal to the X-direction in a horizontal plane is the Y-direction. A vertical direction orthogonal to the X-direction and the Y-direction is the Z-direction. With such a configuration, the printing device 100 forms a part of a substrate production line (production line of a printed circuit board) including two feed lines.

The printing device 100 includes a base 10, two substrate working tables 20a and 20b that hold and feed the print substrate 5, and two printing work units 40a and 40b (see FIG. 4), and is capable of performing feeding and mask printing with respect to two print substrates 5 in parallel. The printing device 100 has a built-in control device 80 described later, such as that shown in FIG. 5, that performs operation control of each unit described below. The substrate working tables 20a and 20b are respectively one example of a "first substrate working table" and "second substrate working table" of the present disclosure.

As shown in FIG. 2, the two substrate working tables 20a and 20b are arranged to be aligned in the Y-direction. The substrate working table 20a on one side has a function of receiving the print substrate 5 in the entrance position Ent, supporting and fixing the print substrate 5 in the printing position P1 at the time of printing work, and discharging the printed print substrate 5 from the exit position Ex1 or Ex2. The substrate working table 20b on another side has a function of receiving the print substrate 5 in the entrance position En2, supporting and fixing the print substrate 5 in the printing position P2 at the time of printing work, and discharging the printed print substrate 5 from the exit position Ex1 or Ex2. That is, the two substrate working tables 20a and 20b are capable of substrate discharging from either the exit position Ex1 or Ex2.

Figure 3:
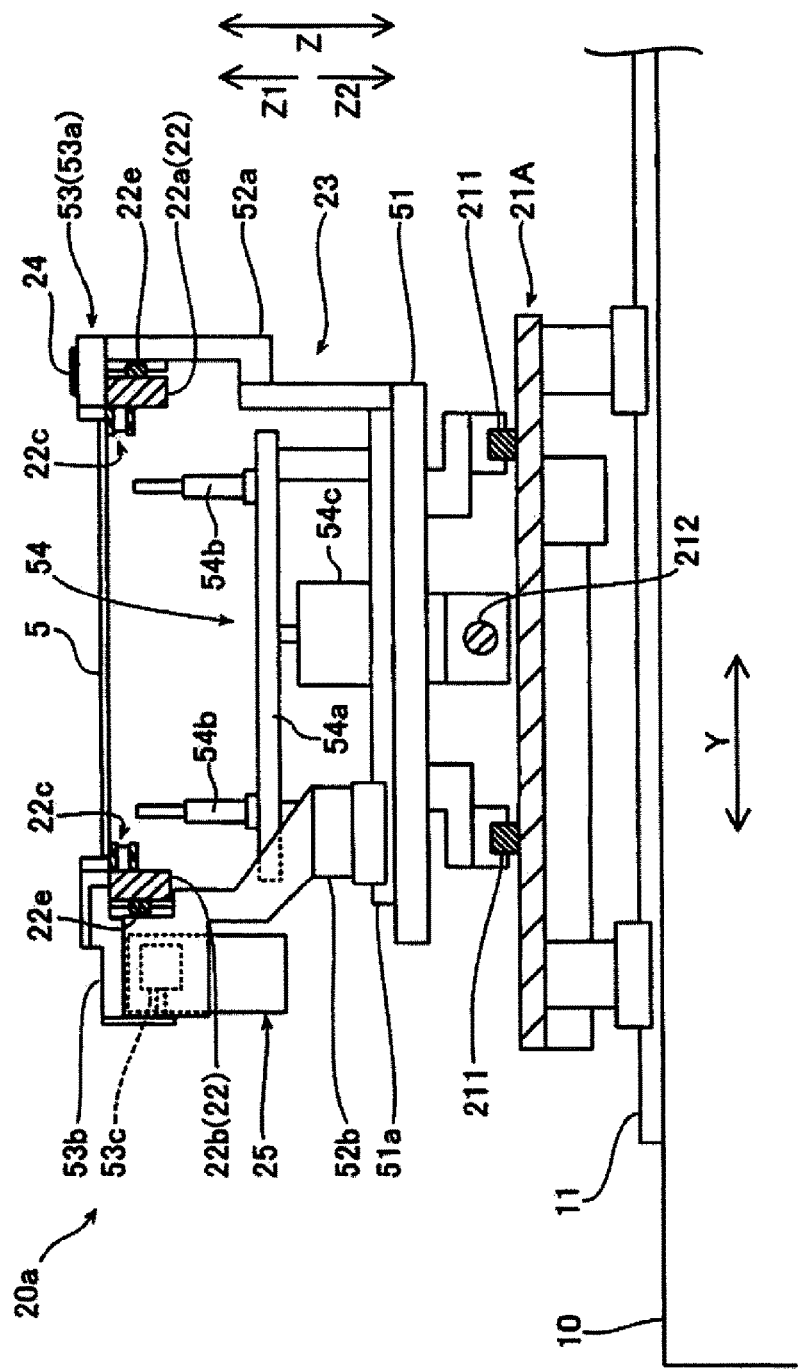
FIG. 3 is a schematic sectional view of a case where the substrate working table forming the printing device according to the first embodiment of the present disclosure is seen from the X-direction.

As shown in FIG. 2 and FIG. 3, the substrate working table 20a on one side includes a movable mount 21A movable in the Y-direction, a pair of feed conveyors 22 arranged on the movable mount 21A and extending in the substrate feed direction (X-direction), a clamp unit 23 with which the print substrate 5 on the feed conveyor 22 is moved in the X-direction while being held (fixed) in a state above and apart from the feed conveyor 22, a table recognition mark 24 provided on the upper surface of the clamp unit 23, and a mask recognition camera 25 provided to the clamp unit 23. The substrate working table 20b on another side is similar in configuration and includes a movable mount 21B movable in the Y-direction, a pair of the feed conveyors 22, the clamp unit 23, the table recognition mark 24 provided on the upper surface of the clamp unit 23, and the mask recognition camera 25 provided to the clamp unit 23.

Since the two substrate working tables 20a and 20b are approximately similar in configuration (structure), only one substrate working table 20a is shown in FIG. 3. In the first embodiment, the table recognition mark 24 of the substrate working table 20a is one example of an "indicator (first indicator)" and "mark" of the present disclosure, and the table recognition mark 24 of the substrate working table 20b is one example of an "indicator (second indicator)" and "mark" of the present disclosure.

As shown in FIG. 2, the movable mounts 21A and 21B of the respective substrate working tables 20a and 20b each have an approximately rectangular shape extending in the feed direction in planar view, and are supported to be movable on four guide rails 11 provided to extend in the Y-direction on the base 10. The respective movable mounts 21A and 21B are each supported by the four common guide rails 11 and moved separately in the Y-direction by two table driving mechanisms. Specifically, the movable mount 21A is driven in the Y-direction by a threaded shaft 12a extending in the Y-direction and a servo motor 13a that rotates and drives the threaded shaft 12a. Similarly, the movable mount 21B is driven in the Y-direction by a threaded shaft 12b extending in the Y-direction and a servo motor 13b that rotates and drives the threaded shaft 12b. Accordingly, the substrate working table 20a on one side is movable in the Y-direction between a retreat position P5 and the exit position Ex2 that is a farther one from the retreat position P5 out of the two exit positions Ex1 and Ex2. The substrate working table 20b on another side is movable in the Y-direction between a retreat position P6 and the exit position Ex1 that is a farther one from the retreat position P6 out of the two exit positions Ex1 and Ex2. That is, the respective substrate working tables 20a and 20b have moving regions that are partially common (moving ranges that overlap).

As shown in FIG. 3, the feed conveyor 22 is a belt conveyor including a pair of conveyor rails 22a and 22b and a pair of feed conveyors 22c that move in a loop, and is supported on a leg unit 22d (see FIG. 1) provided to two ends of the movable mounts 21A and 21B in the X-direction. As shown in FIG. 2, the feed conveyor 22 extends over approximately the entire length of the printing device 100 in the X-direction, such that in the Y-direction introduction and discharge of a substrate is possible through arrangement in a position (Y-axis coordinate) that matches the entrance position Ent or En2 and the exit position Ex1 or Ex2. The Y-axis coordinates of the printing positions P1 and P2 respectively match the Y-axis coordinates of the entrance positions En1 and En2. It is possible for the feed conveyor 22 to accept the subsequent print substrate 5 during printing work and cause the print substrate 5 to stand by in a standby position P3 or P4 on the feed conveyor 22. The conveyor rail 22b on the outside in the Y-direction of the printing device 100 out of the pair of conveyor rails 22a and 22b of the feed conveyor 22 is movable in the Y-direction on the movable mount 21A or 21B. Accordingly, the feed conveyor 22 is changeable in conveyor width in accordance with the size of the print substrate 5.

As shown in FIG. 3, the clamp unit 23 is a movable unit configured to sandwich the feed conveyor 22 from both outer sides in the Y-direction. The clamp unit 23 includes a base unit 51, arm units 52a and 52b respectively arranged on both sides of the feed conveyor 22 in the Y-direction, a clamp mechanism 53 provided to the upper end of the arm units 52a and 52b, and a support mechanism 54 installed on the base unit 51.

As shown in FIG. 2, the base unit 51 is movably supported on a pair of guide rails 211 provided on the movable mount 21A or 21B and extending in the X-direction. To the base unit 51, a threaded shaft 212 provided on the movable mount 21A or 21B and extending in the X-direction is screwed. By the threaded shaft 212 being rotated and driven by a servo motor 213, the base unit 51 moves on the guide rail 211 in the X-direction. As shown in FIG. 3, the arm units 52a and 52b are respectively engaged to be capable of a slide movement in the X-direction with respect to a guide rail 22e assembled to the outer side surfaces of the conveyor rails 22a and 22b of the feed conveyor 22. With this configuration, the entire clamp unit 23 is movable in the X-direction along the guide rail 211 and the feed conveyor 22.

The conveyor rail 22a on one side of the feed conveyor 22 is supported in a state unmovable in the X-direction and the Y-direction with respect to the movable mount 21A or 21B by a supporting device that is not shown. The conveyor rail 22b on another side is supported in a state unmovable in the X-direction and movable in the Y-direction with respect to the movable mount 21A or 21B by a supporting device that is not shown. The supporting device includes a driving device that moves the conveyor rail 22b in the Y-direction.

The arm unit 52a on the inside in the Y-direction out of the arm units 52a and 52b is installed in a fixed manner on the base unit 51, and the arm unit 52b on the outside in the Y-direction is supported to be movable on a guide rail 51a provided on the base unit 51 and extending in the Y-direction. With this configuration, the interval between the arm units 52a and 52b of the clamp unit 23 changes along with a change in conveyor width of the feed conveyor 22. Specifically, the arm unit 52b on the movable side out of the arm units 52a and 52b moves in the Y-direction along with the Y-direction movement of the conveyor rail 22b on the movable side of the feed conveyor 22. Accordingly, the clamp unit 23 is capable of holding the print substrate 5 after the change, even in the case where the width of the print substrate 5 in the Y-direction is changed. The movable mount 21B of the substrate working table 20b on one side is formed with a greater dimension in the Y-direction than the movable mount 21A of the substrate working table 20a on another side, and the conveyor width can be changed more. Thus, compared to the substrate working table 20a, the substrate working table 20b can correspond to the print substrate 5 with a greater width in the Y-direction.

The clamp mechanism 53 includes a clamp unit 53a provided in a fixed manner on the upper end of the arm unit 52a and a movable clamp unit 53b provided on the upper end of the arm unit 52b. The clamp mechanism 53 sandwiches and grips the print substrate 5 on the feed conveyor 22 from both sides in the Y-direction by displacing (driving) the clamp unit 53b in a direction to approach the clamp unit 53a with an air cylinder 53c. The clamp mechanism 53 releases the clamping of the print substrate 5 by activating the air cylinder 53c in the reverse direction.

On the base unit 51, the support mechanism 54 includes a vertically-movable support table 54a installed in a position between the pair of conveyor rails 22a and 22b of the feed conveyor 22, a backup pin 54b provided on the support table 54a, and a vertical movement mechanism 54c. By causing the support table 54a to ascend with the vertical movement mechanism 54c, the print substrate 5 on the feed conveyor 22 is raised and supported. By gripping the print substrate 5 raised by the support mechanism 54, the clamp mechanism 53 holds the print substrate 5 in a fixed manner in a state above and apart from the feed conveyor 22 (feed belt 22c). Accordingly, in a state where the print substrate 5 is held, the entire clamp unit 23 is movable in the X-direction along the feed conveyor 22 up to a position below a screen mask 6, and it is possible to subject the print substrate 5 to printing work on the substrate working table 20a or 20b.

In the first embodiment, as shown in FIG. 2 and FIG. 3, the table recognition mark 24 is a mark for position recognition and is provided on the upper surface of the arm unit 52a (clamp unit 53a) on the fixed side that is located toward the middle of the device in the Y-direction out of the arm units 52a and 52b of the clamp unit 23. The table recognition marks 24 are provided in positions (on the upper surface of the arm unit 52a on the inside in the Y-direction) where the two substrate working tables 20a and 20b correspond to each other. Since the table recognition mark 24 is provided on the upper surface of the arm unit 52a (clamp unit 53a) as described above, image recognition is possible regardless of whether or not the print substrate 5 is held on the substrate working table 20a or 20b.

The mask recognition camera 25 is a CCD area sensor or the like and is attached, with the imaging direction directed upward, to the arm unit 52a on the movable side that is provided on the outside of the clamp unit 23 in the Y-direction. Therefore, the mask recognition camera 25 is movable in the Y-direction along with the movement of the substrate working table 20a or 20b and movable in the X-direction along with the movement of the clamp unit 23. In order to recognize the position and attitude of the screen mask 6, the mask recognition camera 25 images, from below, a mask recognition mark (not shown) provided on the lower surface of the screen mask 6 held by the printing work unit 40a or 40b. The screen mask 6 is one example of a "mask" of the present disclosure.

Figure 4:
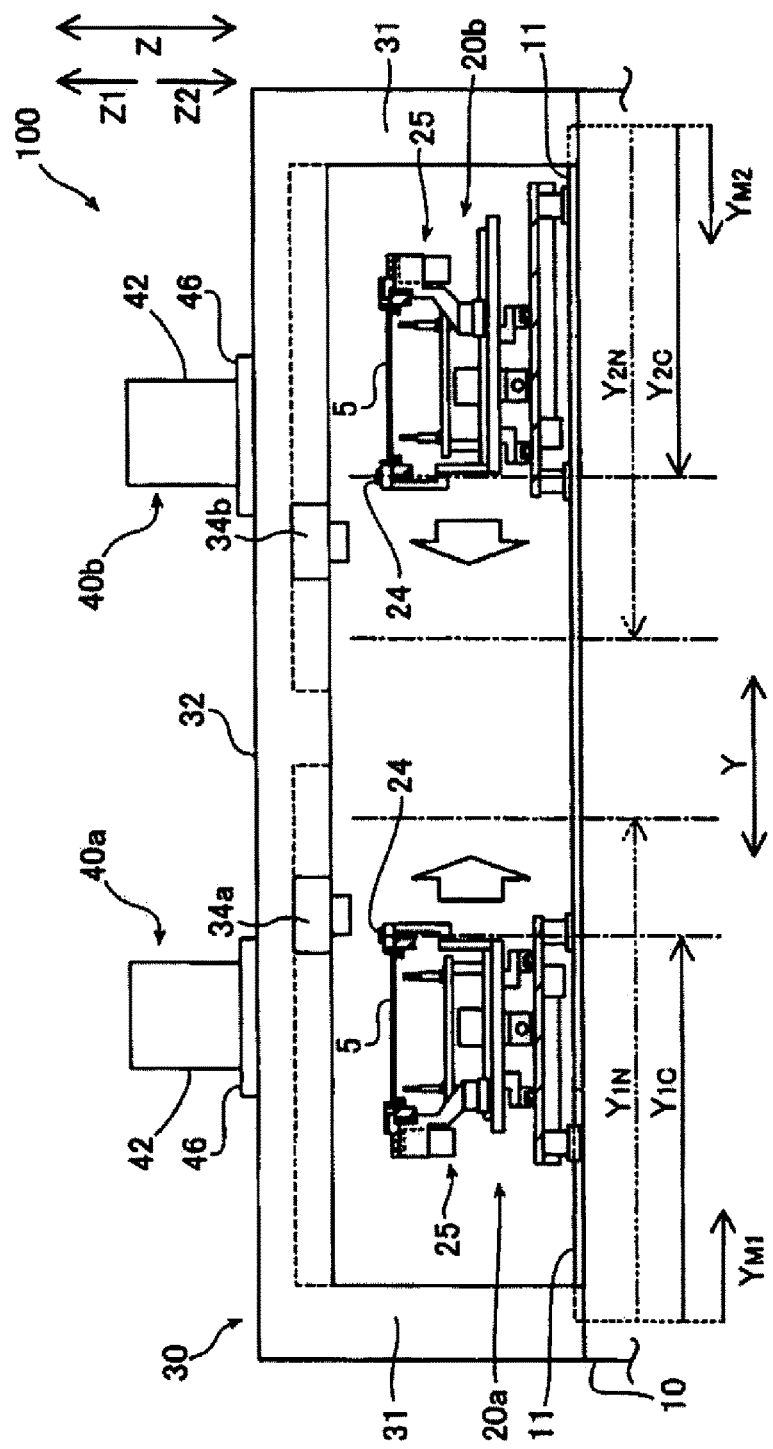
FIG. 4 is a schematic side view of a case where the printing device according to the first embodiment of the present disclosure is seen from the X-direction.

On the base 10, as shown in FIG. 4, a pair of frame structures 30 are arranged (see FIG. 1) with a predetermined interval in the X-direction (substrate feed direction). The frame structure 30 extends in the Y-direction above and over the two substrate working tables 20a and 20b. Each frame structure 30 has a portal structure including a pair of leg units 31 extending upward from the vicinity of both end portions of the base 10 in the Y-direction and a beam unit 32 that joins the upper ends of the leg units 31 in the horizontal direction. The base 10 or the frame structure 30 is one example of a "base side member" of the present disclosure.

In the first embodiment, two substrate recognition cameras 34a and 34b are installed in a fixed manner at the lower surface of the beam unit 32 of the frame structure 30 located on the upstream side (right side in FIG. 1) of the substrate feed direction out of the pair of frame structures 30. Since the frame structure 30 is fixed to the base 10, the two substrate recognition cameras 34a and 34b are coupled and fixed to the base 10. The respective substrate recognition cameras 34a and 34b each correspond to the substrate working tables 20a and 20b and are arranged with a predetermined interval in the Y-direction. The substrate recognition cameras 34a and 34b are a CCD area sensor or the like and installed with the imaging direction directed downward. In order to recognize the position and attitude of the print substrate 5 gripped by the clamp unit 23, the substrate recognition camera 34a or 34b images a substrate recognition mark, not shown, provided to the upper surface of the print substrate 5. The substrate recognition mark is normally provided at four corners or the corner portion of a set of diagonal corners of the print substrate 5. By the substrate recognition mark being imaged by the respective substrate recognition cameras 34a and 34b, the position (position displacement) of the print substrate 5 and the inclination in a horizontal plane is recognized based on corresponding image data. In the first embodiment, the substrate recognition cameras 34a and 34b are capable of imaging the table recognition mark 24 of the substrate working tables 20a and 20b in addition to imaging the substrate recognition mark. In the first embodiment, the substrate recognition camera 34a (or substrate recognition camera 34b) is one example of an "imaging unit" of the present disclosure.

As shown in FIG. 1, the printing work units 40a and 40b are respectively supported at both ends in the X-direction by the pair of frame structures 30 and arranged in positions above the substrate working tables 20a and 20b in printing positions P1 and P2 (see FIG. 2). The printing work units 40a and 40b include a mask holding unit 41 for holding the screen mask 6 and a squeegee unit 42 that prints solder on the print substrate 5 via the screen mask 6.

The mask holding unit 41 includes an approximately rectangular-shaped mask fixing member 43 to which the screen mask 6 is assembled, a mask vertical movement mechanism 44 that causes vertical movement (movement in the Z-axis direction) of the mask fixing member 43, and a pair of mask driving mechanisms 45 for causing Z-axis rotation and causing Y-direction movement of the mask fixing member 43. The screen mask 6 is detachable with respect to the mask fixing member 43.

The mask vertical movement mechanism 44 includes a guide rail, not shown, that supports the mask fixing member 43 to be vertically movable, a threaded shaft, and a Z-axis motor that rotates and drives the threaded shaft. With the Z-axis motor, the mask fixing member 43 is caused to move vertically via the threaded shaft. The mask vertical movement mechanism 44 is supported at both end portions in the X-direction by the pair of frame structures 30. The mask vertical movement mechanism 44 is configured to be movable in the Y-direction on the pair of frame structures 30 and rotatable by a predetermined angle in the X-Y plane.

The mask driving mechanism 45 is formed of a guide rail that supports the mask vertical movement mechanism 44 to be movable in the Y-direction, a threaded shaft that is not shown, and a Y-axis motor that drives the threaded shaft, respectively installed on the frame structure 30. The pair of mask driving mechanisms 45 drive the mask vertical movement mechanism 44 in the Y-direction with the Y-axis motor via the threaded shaft. The pair of mask driving mechanisms 45 move the mask fixing member 43 in the Y-direction while maintaining the attitude of the mask fixing member 43 when both of the mask driving mechanisms 45 are driven at equal speeds, and rotates the mask fixing member 43 in the horizontal plane (X-Y plane) when the respective mask driving mechanisms 45 are driven with a difference in speed.

Accordingly, in the printing work unit 40a or 40b, a precise position (position in the Y-direction and inclination in the horizontal plane) alignment of the screen mask 6 in the X-Y plane is performed with respect to the print substrate 5 introduced to the printing position P1 or P2. The position alignment of the screen mask 6 in the X-direction with respect to the print substrate 5 is done by position adjustment of the clamp unit 23. At the time of printing, the mask holding unit 41 is caused to descend (move in the Z2 direction) by the mask vertical movement mechanism 44 to superimpose the screen mask 6 on the upper surface of the print substrate 5 introduced to the printing position P1 or P2. After printing, the mask holding unit 41 is caused to ascend (move in the Z1 direction) to remove the screen mask 6 from the upper surface of the print substrate 5.

The squeegee unit 42 is supported by the middle portion of a movable beam 46 extending in the X-direction and is arranged above the mask holding unit 41. The squeegee unit 42 includes a squeegee 42a that reciprocally moves (slides) in the Y-direction while pressing solder (not shown) in paste form with respect to the upper surface (surface on the Z1 direction side) of the screen mask 6, a vertical movement mechanism, not shown, that causes vertical movement of the squeegee 42a, and a squeegee angle variable mechanism, not shown, for changing the inclination direction and inclination angle of the squeegee 42a with respect to the screen mask 6. The movable beam 46 is movably supported on a pair of guide rails 33 respectively fixed on the upper surface of the pair of frame structures 30 and extending in the Y-direction. To the movable beam 46, a threaded shaft, not shown, provided to the frame structure 30 and extending in the Y-direction is screwed. By the threaded shaft being rotated and driven by a squeegee shaft motor 36, the movable beam 46 moves in the Y-direction. The squeegee unit 42 (squeegee 42a) moves in the Y-direction along with the movement of the movable beam 46, and the printing operation is performed.

Figure 5:
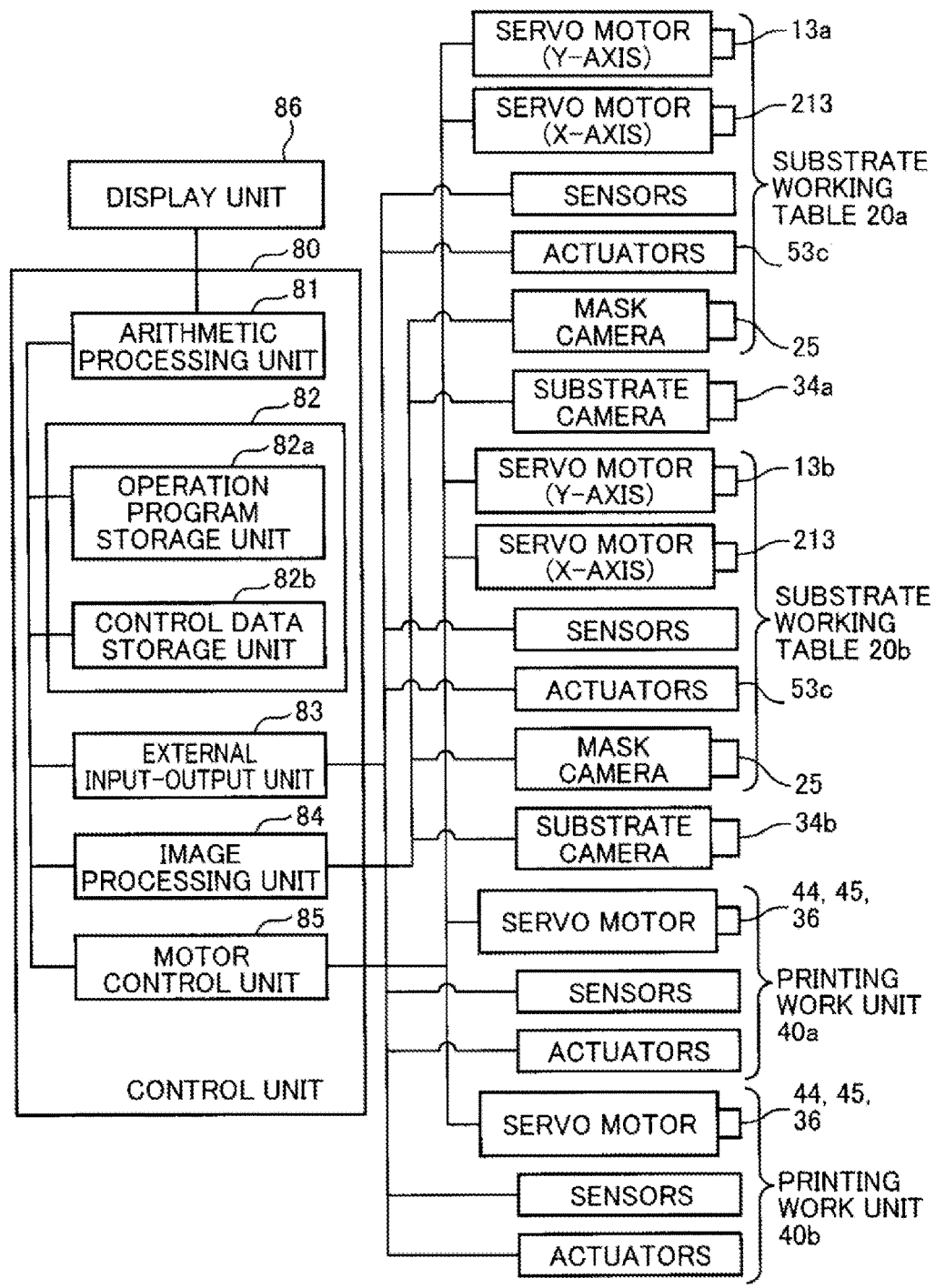
FIG. 5 is a block diagram showing the control configuration of the printing device according to the first embodiment of the present disclosure.

As shown in FIG. 5, the control device 80 includes an arithmetic processing unit 81, a storage unit 82, an external input-output unit 83, an image processing unit 84, and a motor control unit 85. The control device 80 is connected to a display unit 86. The arithmetic processing unit 81 is one example of a "control unit" of the present disclosure.

The arithmetic processing unit 81 is formed of a CPU and controls the overall operation of the printing device 100. The storage unit 82 includes an operation program storage unit 82a that stores a control program executable by the arithmetic processing unit 81 and a control data storage unit 82b that stores data necessary upon performing the printing operation.

The external input-output unit 83 has a function of controlling the input and output from various sensors and actuators. The image processing unit 84 has a role of performing processing of image data imaged by each of the two substrate recognition cameras 34a and 34b and the two mask recognition cameras 25 to internally create data necessary for the operation of the printing device 100. In this case, the image processing for image data of the table recognition mark 24 imaged by the substrate recognition camera 34a or 34b is performed by the image processing unit 84. Based on the image data subjected to the image processing and position data of the substrate recognition camera 34a or 34b stored in the control data storage unit 82b in advance, the arithmetic processing unit 81 acquires the position coordinate of the substrate working table 20a or 20b in the Y-direction when the center of imaging by the substrate recognition camera 34a (or 34b) and the position of the table recognition mark 24 match in the Y-direction.

Based on a control signal output from the arithmetic processing unit 81, the motor control unit 85 controls the respective servo motors (servo motors 13a and 13b (see FIG. 2) that move the substrate working tables 20a and 20b in the Y-direction, the servo motor 213 (see FIG. 3) that moves the clamp unit 23 in the X-direction, a belt driving motor (not shown) of the feed conveyor 22, and the like) of the printing device 100. Based on a signal from an encoder (not shown) included in the respective servo motors, the motor control unit 85 recognizes the position coordinate of the substrate working table 20a or 20b in the Y-axis direction, the position of the clamp unit 23 in the X-Y plane, the height position (position in the Z-direction) and rotation position (rotation angle in the X-Y plane) of the mask holding unit 41, or the like.

In the first embodiment, the control device 80 (arithmetic processing unit 81) determines, for each of the substrate working tables 20a and 20b, whether or not the substrate working tables 20a and 20b interfere with each other at the time of movement based on position information obtained by imaging and recognizing the table recognition mark 24 with the substrate recognition camera 34a (or 34b). Hereinafter, details of the interference determination will be described.

First, as shown in FIG. 4, the Y-axis of the substrate working table 20a is shown with ($Y_{M1}$), and the Y-axis of the substrate working table 20b is shown with ($Y_{M2}$). For the Y-axis coordinate, the position on the outside end in the Y-direction in the case where the substrate working tables 20a and 20b are each located on the outside end of a Y-direction movement range is taken as the origin, and the direction in which the substrate working tables 20a and 20b approach each other is positive. For a simple description, the position coordinate of the table recognition marks 24 provided on the respective substrate working tables 20a and 20b are used to show the positions of the substrate working tables 20a and 20b. That is, for example, a Y-axis coordinate $Y_{1C}$ of the substrate working table 20a indicates that the position coordinate of the table recognition mark 24 of the substrate working table 20a in the Y-axis ($Y_{M1}$) is $Y_{1C}$. Hereinafter, an example in which the substrate recognition camera 34a on the substrate working table 20a side out of the two substrate recognition cameras 34a and 34b is used to recognize the table recognition mark 24 will be described. Note that a case where the substrate recognition camera 34b on the substrate working table 20b side is used is similar.

Figure 6:
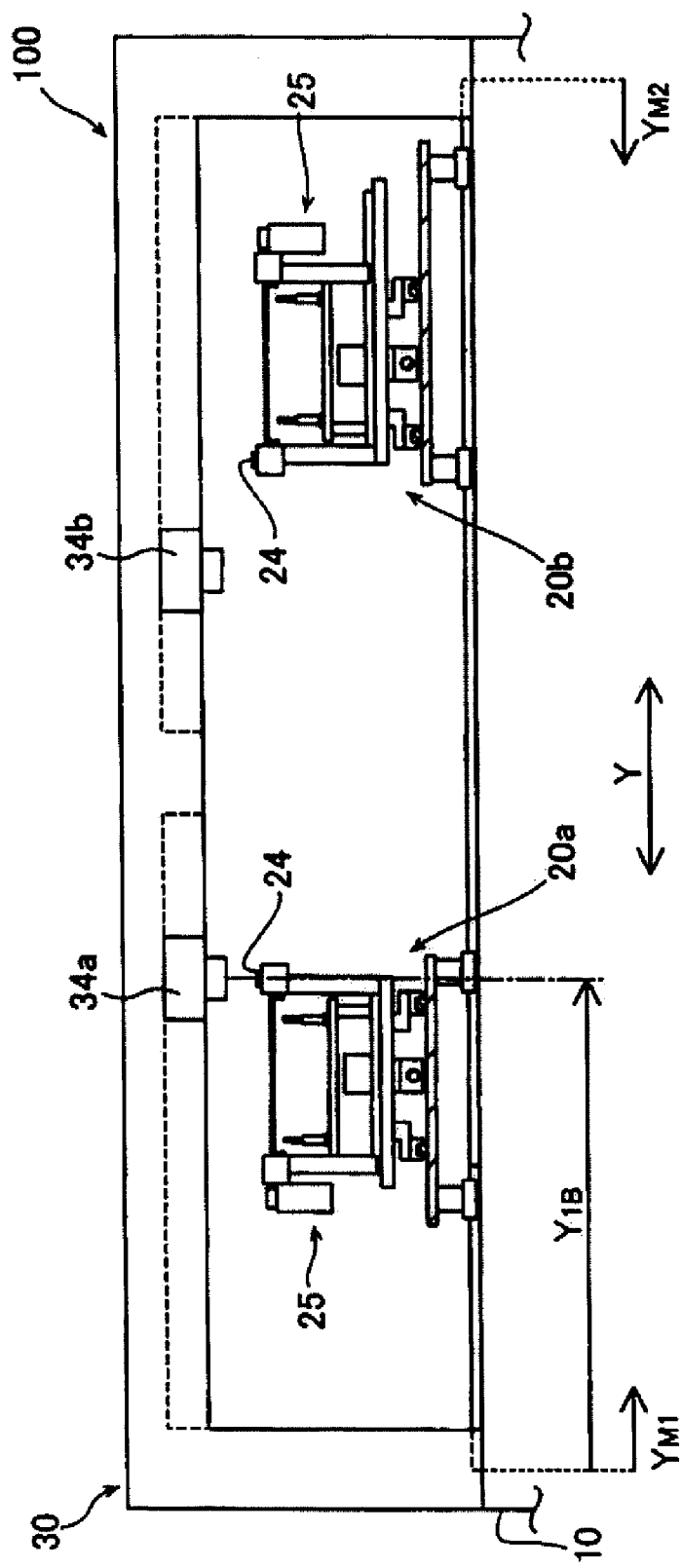
FIG. 6 is a schematic view for illustrating a method of acquiring a position coordinate of the substrate working table in the printing device according to the first embodiment of the present disclosure.

First, acquisition of the position coordinate for interference determination is performed. As shown in FIG. 6, the substrate working table 20a is moved to position the table recognition mark 24 below the substrate recognition camera 34a, and the table recognition mark 24 is imaged by the substrate recognition camera 34a in this state to perform image recognition thereof. In the case where a position displacement occurs in the actual position coordinate of the substrate working table 20a with respect to the Y-coordinate value (design Y-coordinate value) of the substrate working table 20a based on encoder output at this time, the position of the table recognition mark 24 is displaced in the Y-direction from the center of imaging by the substrate recognition camera 34a. Through image recognition of the position displacement, the Y-coordinate value of the substrate working table 20a is corrected based on the displacement amount and position data of the substrate recognition camera 34b, and an actual position coordinate ($Y_{1B}$) of the substrate working table 20a when the center of imaging by the substrate recognition camera 34a and the position of the table recognition mark 24 match in the Y-direction is obtained.

Figure 7:
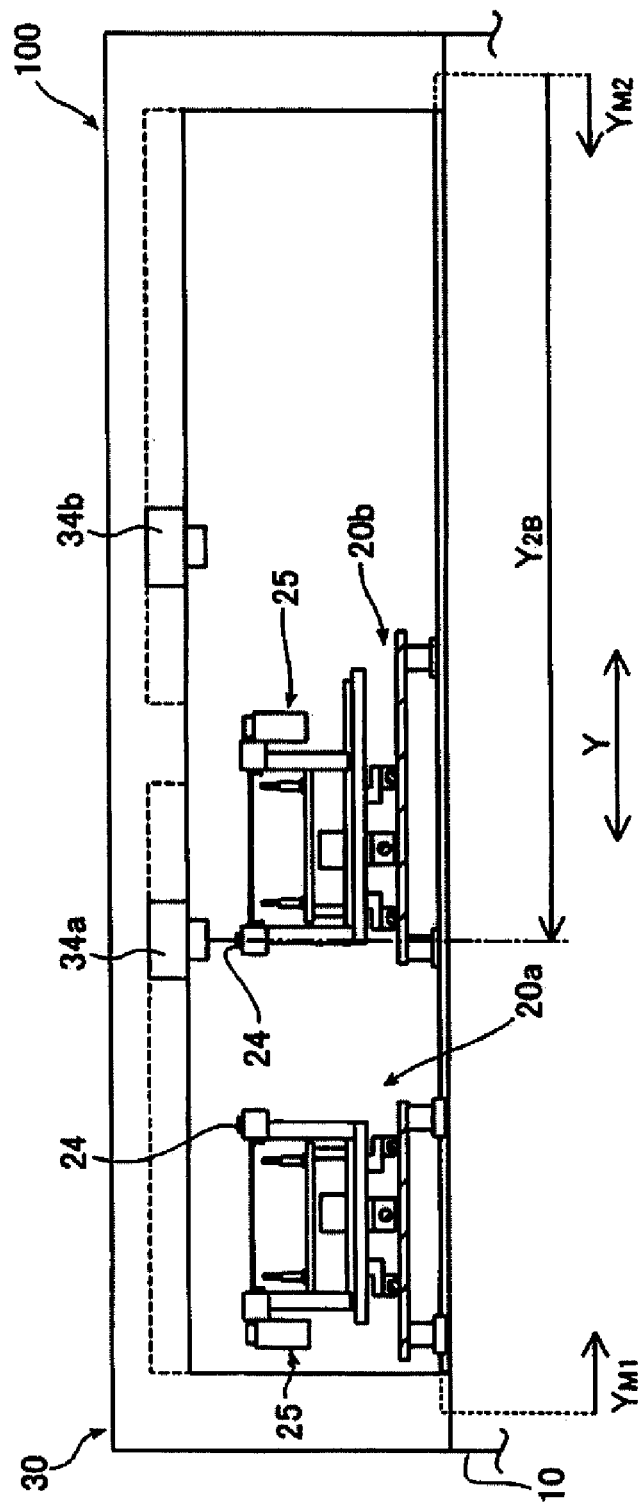
FIG. 7 is a schematic view for illustrating the method of acquiring a position coordinate of the substrate working table in the printing device according to the first embodiment of the present disclosure.

As shown in FIG. 7, the substrate working table 20b is similarly moved to position the table recognition mark 24 in the same position below the substrate recognition camera 34a, and the table recognition mark 24 is imaged by the substrate recognition camera 34a in this state to perform image recognition thereof. The Y-coordinate value of the substrate working table 20b is corrected by the amount of position displacement acquired by image recognition, and an actual position coordinate ($Y_{2B}$) of the substrate working table 20b when the center of imaging by the substrate recognition camera 34a and the position of the table recognition mark 24 match in the Y-direction is obtained.

Figure 8:
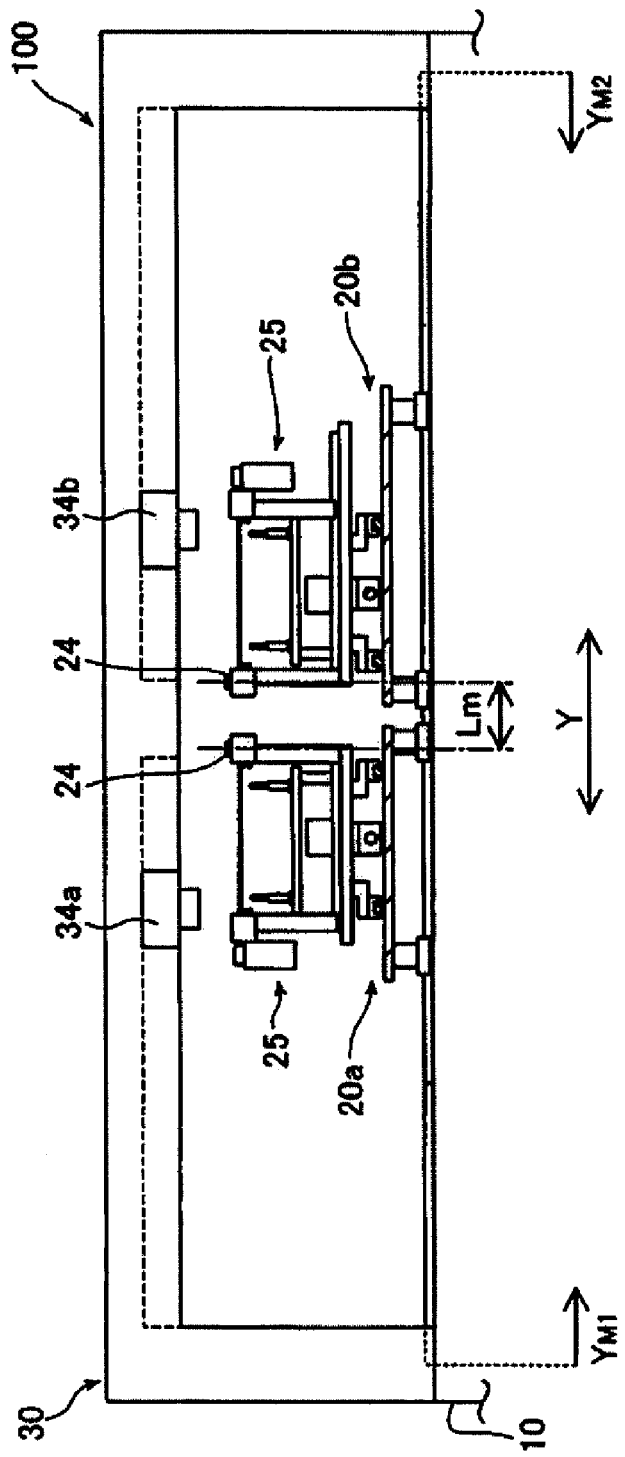
FIG. 8 is a schematic view for illustrating a minimum interval between the substrate working tables in the printing device according to the first embodiment of the present disclosure.

As shown in FIG. 8, the distance between the two table recognition marks 24 in a state where the substrate working table 20a and the substrate working table 20b are closest without interfering with each other is a minimum interval $L_m$. The minimum interval $L_m$ is a value calculated from a measured or design value.

Using the three parameters ($Y_{1B}$, $Y_{2B}$, and $L_m$) above, an interference reference distance $L_i$ below is obtained (set).

$$Y_{1B}+Y_{2B}-L_m=L_i \text{(Interference Reference Distance)}$$

The interference reference distance is a value in which the minimum interval $L_m$ is subtracted from the sum of the respective Y-coordinates when the two substrate working tables 20a and 20b are each moved to the same position (position below the substrate recognition camera 34a). The value is the sum of the respective Y-coordinates in a state where one of the substrate working tables 20a and 20b hypothetically in the same position is moved by $L_m$ in the negative direction. In this state, the substrate working table 20a and the substrate working table 20b do not interfere, and the interval thereof is the minimum interval $L_m$. For example, in the case where the Y-coordinates of the substrate working tables 20a and 20b are respectively $Y_1$ and $Y_2$, $Y_1+Y_2=L_i$ (interference reference distance) regardless of the Y-direction position of the two substrate working tables 20a and 20b, in a state where the two substrate working tables 20a and 20b have approached such that the interval between the two substrate working tables 20a and 20b is the minimum interval $L_m$. That is, the interference reference distance ($L_i$) is the sum of moving distances (Y-coordinate values) of the respective substrate working tables 20a and 20b when the respective substrate working tables 20a and 20b have each been caused to approach from the origin position up to a position of the minimum interval $L_m$.

When the current coordinates for Y-coordinates of the substrate working tables 20a and 20b are $Y_{1C}$ and $Y_{2C}$ and the moving target coordinates for Y-coordinates of the substrate working tables 20a and 20b are $Y_{1N}$ and $Y_{2N}$ as shown in FIG. 4, it is possible to determine the presence or absence of interference in the following manner using the interference reference distance $L_i$.

Case where only the substrate working table 20a moves
  $Y_{1N}+Y_{2C}<L_i$: no interference
  $Y_{1N}+Y_{2C}\geq L_i$: interference
Case where only the substrate working table 20b moves
  $Y_{1C}+Y_{2N}<L_i$: no interference
  $Y_{1C}+Y_{2N}\geq L_i$: interference
Case where both of the substrate working table 20a and the substrate working table 20b move
  $Y_{1N}+Y_{2N}<L_i$: no interference
  $Y_{1N}+Y_{2N}\geq L_i$: interference Thus, in the first embodiment, the actual position coordinates $Y_{1B}$ and $Y_{2B}$ of the substrate working tables 20a and 20b when the substrate recognition camera 34a has recognized the table recognition mark 24 of each of the substrate working tables 20a and 20b (when the center of imaging by the substrate recognition camera 34a has matched with the table recognition mark 24 in the Y-direction) are acquired before substrate printing work. Being a fixed value and therefore known, the minimum interval $L_m$ is stored in the control data storage unit 82b at the point of shipping of the printing device.

During the printing work, the arithmetic processing unit 81 determines the presence or absence of interference as described above using the interference reference distance $L_i$, and performs predetermined interference avoidance processing in the case where it is determined that the substrate working tables 20a and 20b interfere with each other at the time of movement. In the first embodiment, the arithmetic processing unit 81 causes the table recognition mark 24 to be imaged by the substrate recognition camera 34a at a predetermined timing at the time of printing work to acquire the position coordinates $Y_{1B}$ and $Y_{2B}$. The arithmetic processing unit 81 updates (corrects) the interference reference distance $L_i$ with the position coordinates $Y_{1B}$ and $Y_{2B}$ newly acquired during the work. In the example of FIG. 4 and FIG. 6 to FIG. 8, the two substrate recognition cameras 34a and 34b are shown for the printing device 100. However, the configuration may be such that only one is included in the first embodiment.

Next, referring to FIG. 1, FIG. 3, FIG. 6, FIG. 7, and FIG. 9 to FIG. 13, the operation control at the time of the substrate printing work of the printing device 100 according to the first embodiment of the present disclosure will be described. Hereinafter, for a better understanding on the interference by the substrate working tables 20a and 20b, an example in which the substrate working table 20a performs substrate discharging from the exit position Ex2 and the substrate working table 20b performs substrate discharging from the exit position Ex1 will be described. Control processing below is performed by the control device 80 (arithmetic processing unit 81). FIG. 10 to FIG. 13 show a state where substrate production is performed consecutively based on a flowchart shown in FIG. 9.

Figure 9:
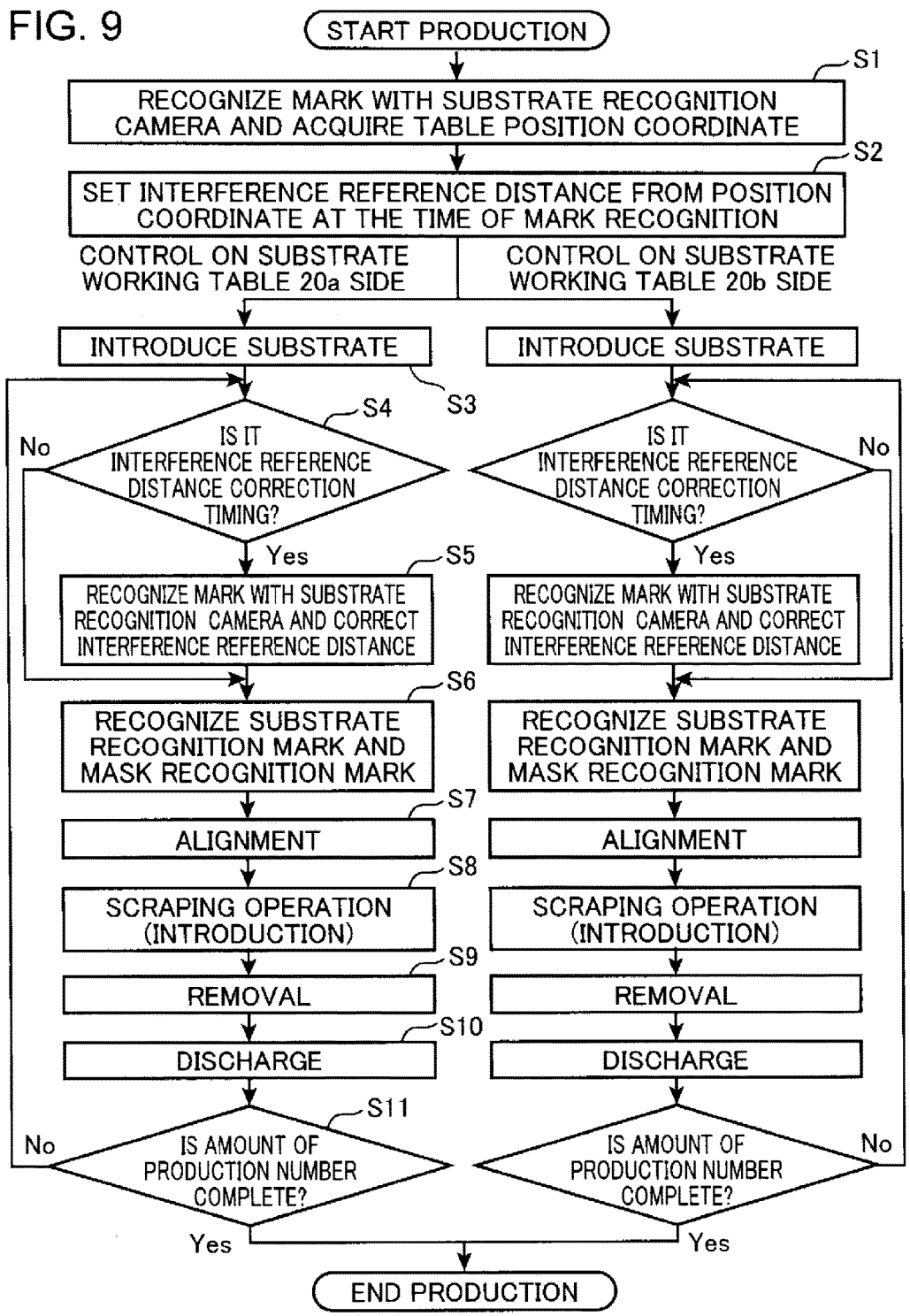
FIG. 9 is a flow diagram of control at the time of substrate printing work of the printing device according to the first embodiment of the present disclosure.

First, as shown in FIG. 9, processing of step S1 and step S2 is performed as a preliminary preparation before the substrate printing work. In step S1, as shown in FIG. 6 and FIG. 7, the table recognition mark 24 of the respective substrate working tables 20a and 20b is imaged by the substrate recognition camera 34a, and the table recognition mark 24 is recognized by the arithmetic processing unit 81 based on corresponding image data. Based on the image recognition result, the position coordinates $Y_{1B}$ and $Y_{2B}$ of the substrate working tables 20a and 20b when the substrate recognition camera 34a has imaged the table recognition mark 24 are acquired (obtained) by the arithmetic processing unit 81 and stored in the control data storage unit 82b.

Next, in step S2, the interference reference distance $L_i$ described above is obtained by the arithmetic processing unit 81 and stored in the control data storage unit 82b based on the position coordinates $Y_{1B}$ and $Y_{2B}$ and the minimum interval $L_m$ stored in the control data storage unit 82b in advance. Accordingly, the preliminary preparation before the substrate printing work is completed. In the processing thereafter, the printing operation by the substrate working table 20a and the printing work unit 40a and the printing operation by the substrate working table 20b and the printing work unit 40b are carried out in parallel. Since the respective printing work operations are the same in principle, work on the substrate working table 20a side will be described.

Figure 10:
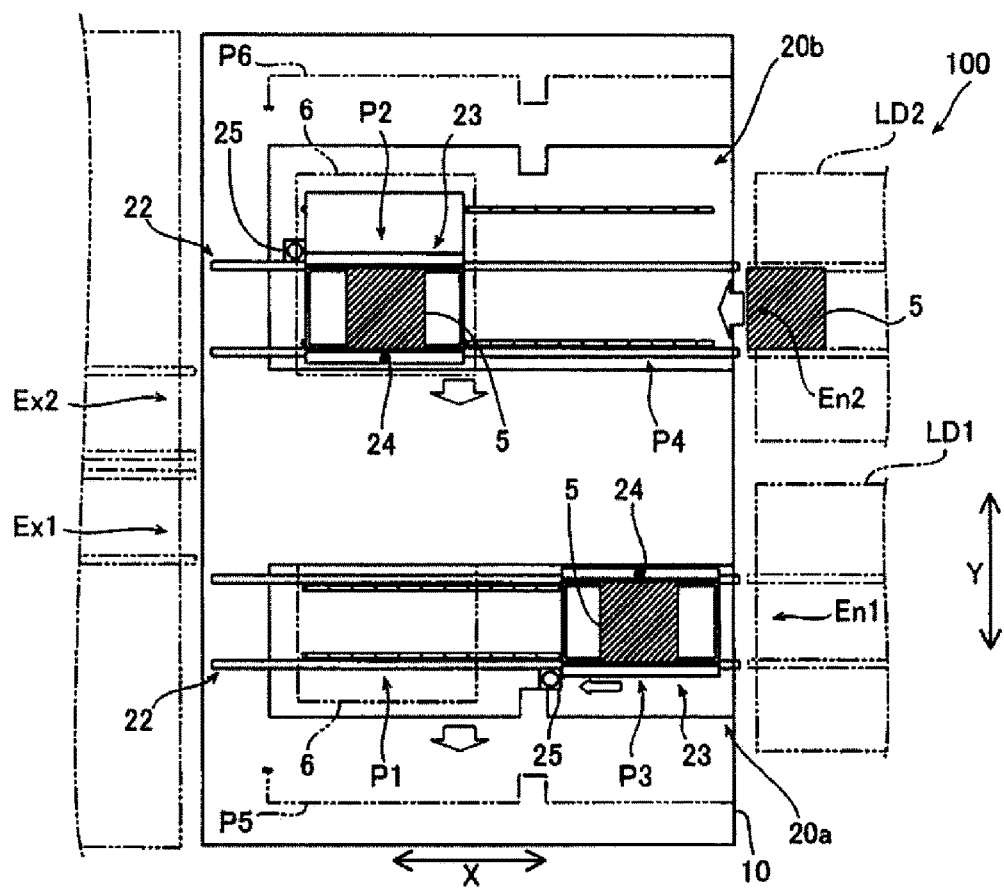
FIG. 10 is a schematic view showing the positional relationship of the substrate working tables at the time of substrate printing work of the printing device according to the first embodiment of the present disclosure.

First, in step S3, the substrate working table 20a is arranged to match the entrance position En1 (printing position P1) in the Y-direction. Accordingly, the print substrate 5 is introduced onto the feed conveyor 22. As shown in FIG. 10, the print substrate 5 moves in the X-direction on the feed conveyor 22 to be fed to the standby position P3, and is clamped by the clamp unit 23 in the standby position P3. That is, by the support mechanism 54 and the clamp mechanism 53 (see FIG. 3), the print substrate 5 is held in a fixed manner above the feed conveyor 22 (feed belt 22c).

Next, in step S4, whether or not it is a correction timing for the interference reference distance $L_i$ is determined by the arithmetic processing unit 81. The correction timing is set to be performed, for example, upon lapse of every predetermined time (for example, 10 minutes) after the start of work or upon completing printing of every predetermined number (for example, one hundred) of the print substrates 5. In the case where it is not the correction timing, it proceeds to step S6.

When it is determined as the correction timing for the interference reference distance $L_i$, imaging (see FIG. 6) of the table recognition mark 24 by the substrate recognition camera 34a is performed in step S5. Accordingly, the position coordinate $Y_{1B}$ of the substrate working table 20a is newly acquired by the arithmetic processing unit 81, and the interference reference distance $L_i$ is updated (corrected) based on the position coordinate $Y_{1B}$.

In step S6, the clamp unit 23 starts the movement in the X-direction toward the printing position P1, and the substrate working table 20a starts the movement in the Y-direction toward the retreat position P5 (see FIG. 10). Accordingly, the X-direction movement of the clamp unit 23 holding the print substrate 5 and the Y-direction movement of the substrate working table 20*a* are performed in synchronization. During the movement, imaging (image recognition) of the substrate recognition mark of the print substrate 5 by the substrate recognition camera 34*a* and imaging (image recognition) of the mask recognition mark by the mask recognition camera 25 are performed. At this time, imaging of the substrate recognition mark is performed with the substrate recognition mark of the print substrate 5 being positioned below the substrate recognition camera 34*a*. Imaging of the mask recognition mark is performed with the mask recognition camera 25 being positioned below the mask recognition mark of the screen mask 6 (see FIG. 2). Based on image data thereof, the relative positional relationship between the position and attitude of the print substrate 5 held by the clamp unit 23 and the position and attitude of the screen mask 6 mounted to the mask fixing member 43 is recognized by the arithmetic processing unit 81.

Figure 12:
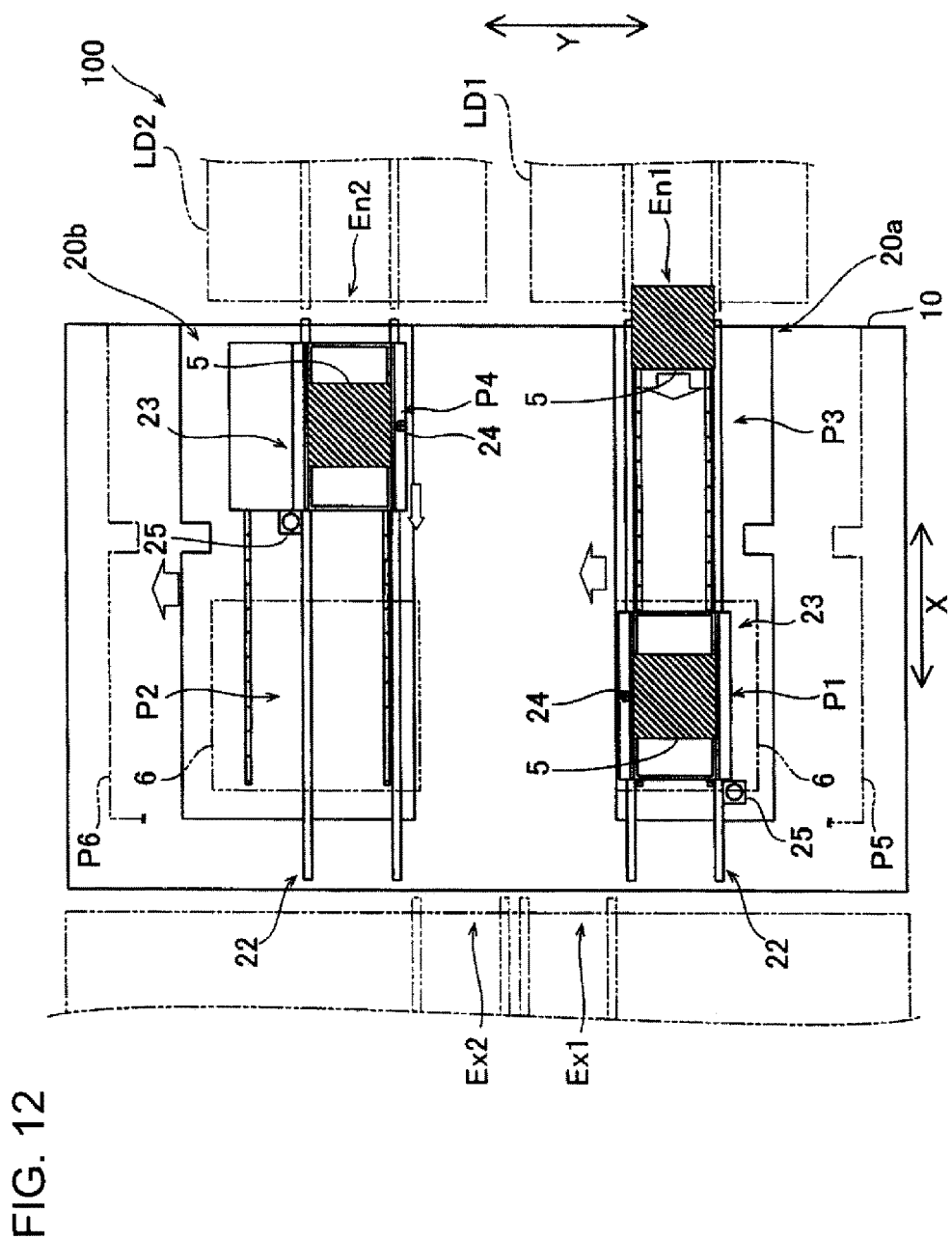
FIG. 12 is a schematic view showing the positional relationship of the substrate working tables at the time of substrate printing work of the printing device according to the first embodiment of the present disclosure.

Next, in step S7, as shown in FIG. 12, the clamp unit 23 is positioned in the printing position P1, and alignment of the print substrate 5 and the screen mask 6 is performed. First, based on the recognition result in step S6, the position is corrected such that the horizontal positions (in the X-direction and Y-direction and the angle in the X-Y plane) of the print substrate 5 and the screen mask 6 match. The mask vertical movement mechanism 44 (see FIG. 1) causes the screen mask 6 to descend, and the screen mask 6 is pressed against the print substrate 5 with a predetermined pressing force to be adhered.

When the alignment is completed, the squeegee unit 42 (movable beam 46) is driven in the Y-direction (as a scraping operation) in step S8 in a state where solder is supplied on the screen mask 6. Accordingly, solder is printed on the upper surface of the print substrate 5 via the screen mask 6. During the printing work in the printing position P1, the subsequent print substrate 5 is introduced onto the feed conveyor 22 from the entrance position En1, and the print substrate 5 moves in the X-direction on the feed conveyor 20 to be fed to the standby position P3.

In step S9, after printing of solder, the screen mask 6 is caused to ascend in the Z1 direction to perform removal. Clamping of the printed print substrate 5 by the clamp mechanism 53 and raising of the print substrate 5 by the support mechanism 54 are respectively released, and the print substrate 5 is placed on the feed conveyor 22.

Figure 13:
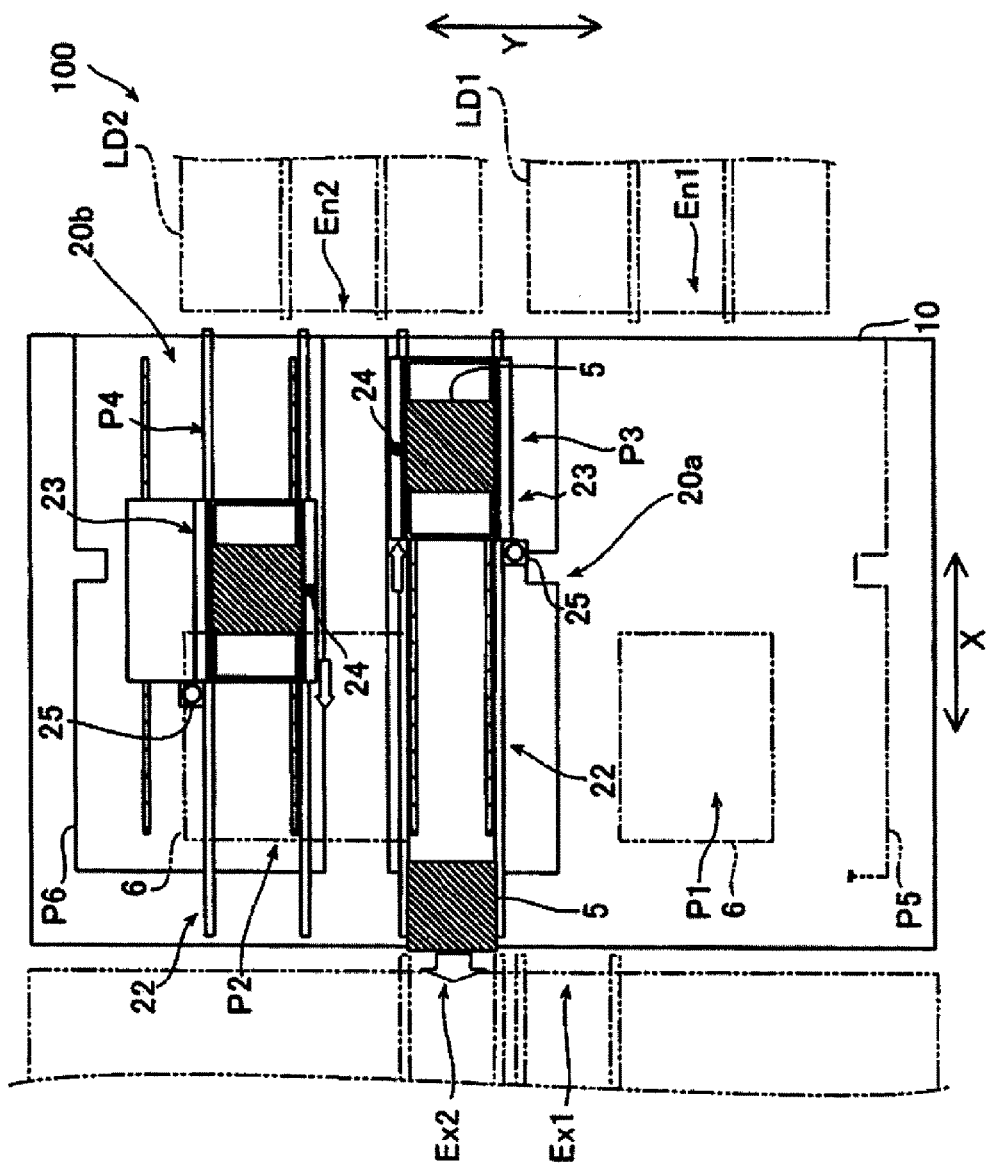
FIG. 13 is a schematic view showing the positional relationship of the substrate working tables at the time of substrate printing work of the printing device according to the first embodiment of the present disclosure.

In step S10, as shown in FIG. 13, the printed print substrate 5 is discharged in the exit position Ex2. At this time, the substrate working table 20*a* (feed conveyor 22) is arranged to match the exit position Ex2 in the Y-direction. The subsequent print substrate 5 arranged in the standby position P3 through movement of the clamp unit 23 in the X-direction is held in a fixed manner above the feed conveyor 22 (feed belt 22*c*) by the support mechanism 54 and the clamp mechanism 53. Accordingly, only the printed print substrate 5 is discharged from the feed conveyor 22 positioned in the exit position Ex2. The substrate working table 20*b* retreats to the retreat position P6 from the entrance position En2 as a result of the interference avoidance processing described later.

In step S11, whether or not the solder printing work of a predetermined production number of the print substrates 5 has been completed is determined by the arithmetic processing unit 81. In the case where the production number is not reached, it returns to step S4 to continue performing the solder printing in steps S4 to S10. In the case where the solder printing work of the predetermined production number of the print substrates 5 has been completed, the solder printing work operation is completed.

Figure 11:
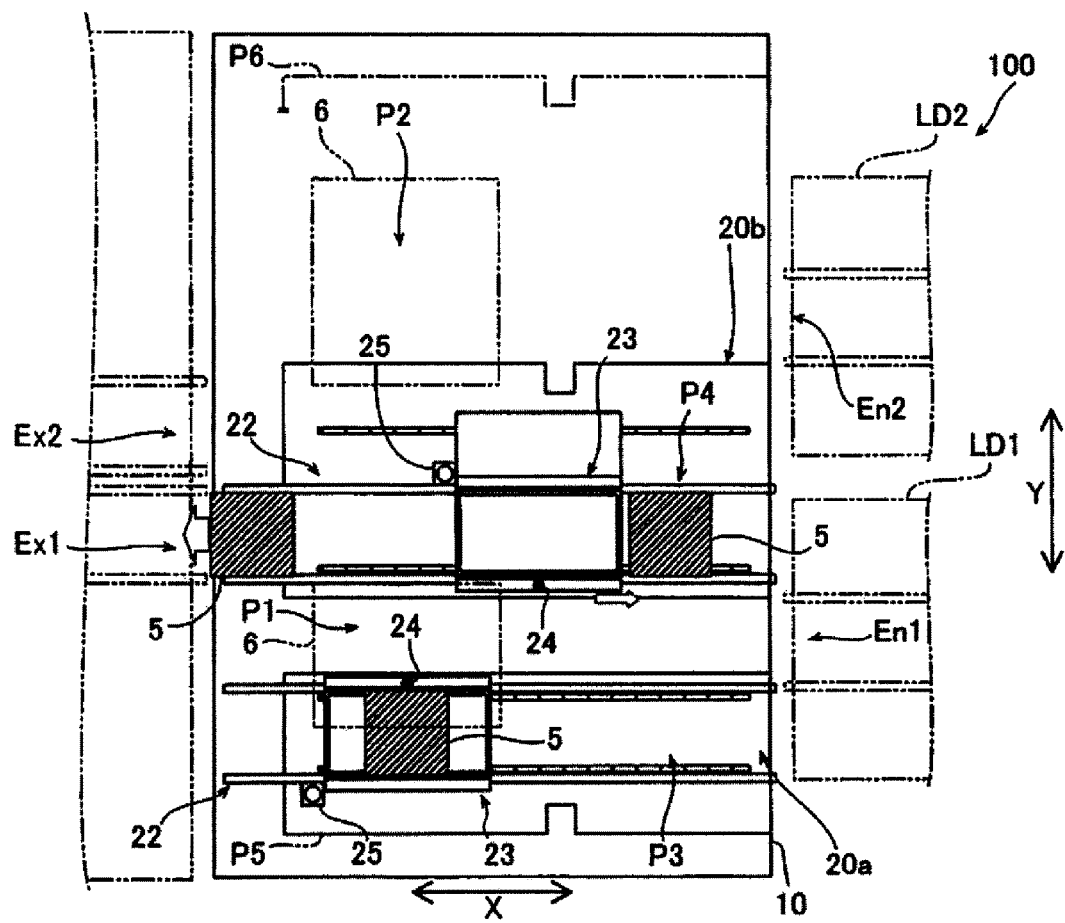
FIG. 11 is a schematic view showing the positional relationship of the substrate working tables at the time of substrate printing work of the printing device according to the first embodiment of the present disclosure.

On the substrate working table 20*b* side, the operation control is performed with a certain time difference with respect to the operation of the substrate working table 20*a*. Thus, at the time of substrate production, as shown in FIG. 10, printing on the substrate working table 20*b* side is performed in the printing position P2 between substrate introduction and clamping of the print substrate 5 in the standby position P3 on the substrate working table 20*a* side. As shown in FIG. 11, substrate discharging on the substrate working table 20*b* side is performed in the exit position Ex1. At this time, as a result of the interference avoidance processing, the substrate working table 20*a* retreats to the retreat position P5 from the entrance position En1. During the retreat movement, imaging of the substrate recognition mark and the mask recognition mark (step S6) is performed on the substrate working table 20*a* side. In this manner, as shown in FIG. 10 to FIG. 13, printing of the print substrate 5 is performed alternately in the respective positions P1 and P2, and the operations of substrate discharging to the surface mounting machine M on the downstream side are performed alternately.

Therefore, correction processing for the interference reference distance $L_i$ in step S5 is not necessarily performed at the same timing. Thus, in the correction processing for the interference reference distance $L_i$, the position coordinate $Y_{1B}$ of the substrate working table 20*a* and the position coordinate $Y_{2B}$ of the substrate working table 20*b* are acquired at the same timing or separate timings, and reflected (corrected) in the interference reference distance $L_i$ respectively at the acquired timings.

Next, referring to FIG. 11, FIG. 12, and FIG. 14, the Y-axis (Y-direction) movement operation control of the substrate working tables 20*a* and 20*b* at the time of the substrate printing work by the printing device 100 will be described. Control processing below is performed by the control device 80 (arithmetic processing unit 81).

The control is carried out separately (for each substrate working table) at the time of the Y-axis movement of the substrate working tables 20*a* and 20*b*. Since the movement operation control of the substrate working tables 20*a* and 20*b* is the same, a case where the substrate working table 20*a* on one side performs the Y-axis movement will be described.

Figure 14:
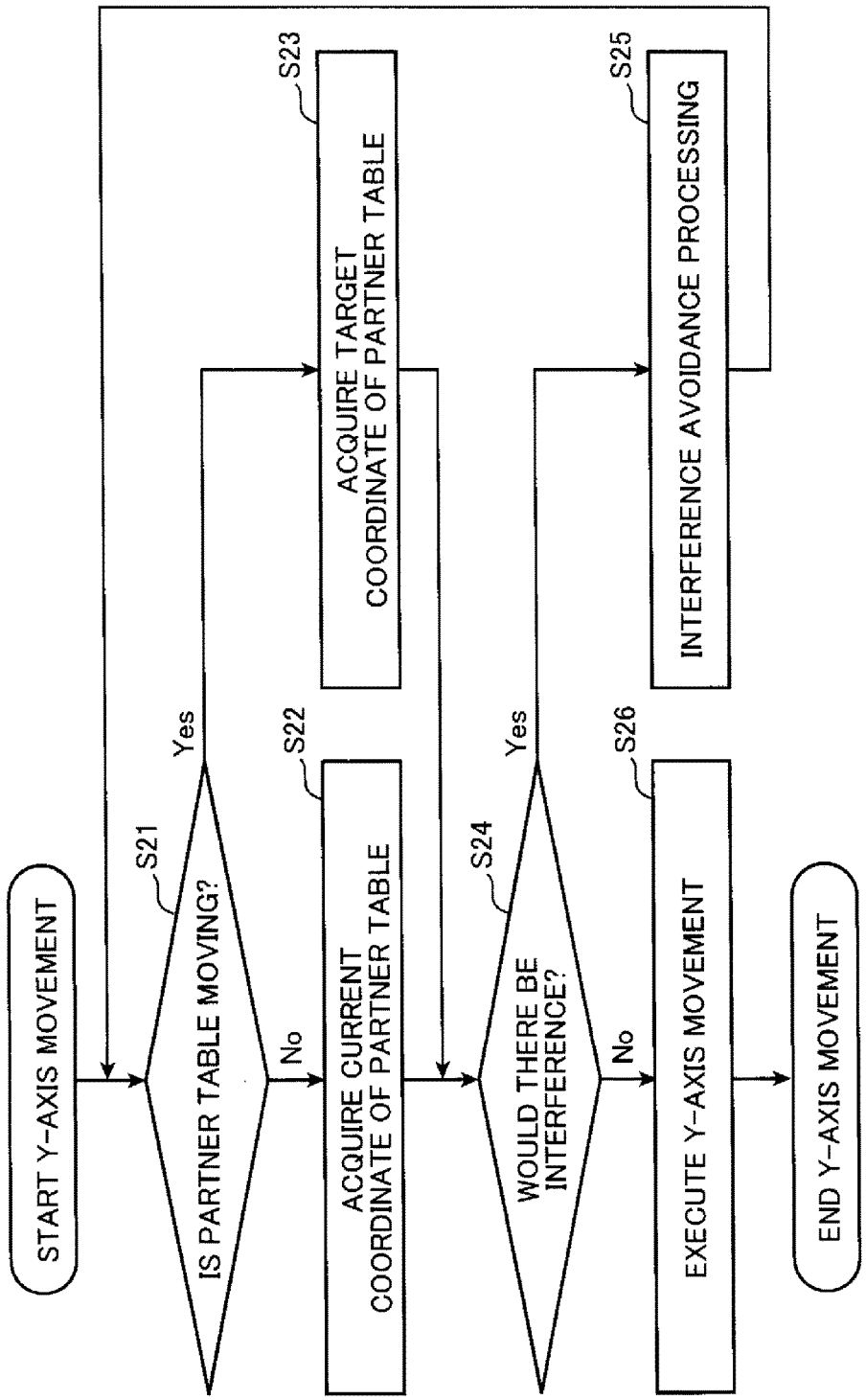
FIG. 14 is a flow diagram of control at the time of Y-axis movement of the substrate working table of the printing device according to the first embodiment of the present disclosure.

As shown in FIG. 14, when a home table (substrate working table 20*a*) starts the Y-axis movement, whether or not a partner table (substrate working table 20*b*) is moving is first determined by the arithmetic processing unit 81 in step S21. In the case where the partner table is not moving, the current coordinate $Y_{2C}$ of the partner table is acquired in step S22. In the case where the partner table is moving, the moving target coordinate $Y_{2N}$ of the partner table is acquired in step S23.

Next, in step S24, whether or not there would be interference with the partner table as a result of the movement of the home table is determined by the arithmetic processing unit 81. That is, the presence or absence of interference is determined based on the relationship described above between the sum of the moving target coordinate $Y_{1N}$ of the home table and the Y-axis coordinate (the current coordinate $Y_{2C}$ or the moving target coordinate $Y_{2N}$) of the partner table and the interference reference distance $L_i$.

In the case where it is determined that there would be interference in step S24, it proceeds to step S25, and the predetermined interference avoidance processing is executed by the arithmetic processing unit 81.

In the interference avoidance processing, processing in accordance with the operation state of the partner table is executed. For example, in the case where the partner table is moving, either the home table or the partner table is caused to standby or be moved to a predetermined retreat position where there would not be interference. In this case, one that has started the movement earlier is prioritized, or the substrate working table closer to the target position is prioritized. In the case where the partner table is during a stop in movement, it is possible to perform processing such that the home table is caused to stop and standby on the spot until the partner table moves to a position where there would not be interference. Accordingly, the home table (substrate working table 20a) retreats to the retreat position P5 while the partner table (substrate working table 20b) moves to the exit position Ex1 in the example in FIG. 11, and the partner table (substrate working table 20b) retreats to the retreat position P6 while the home table (substrate working table 20a) moves to the exit position Ex2 in the example in FIG. 12.

In the case where the interference avoidance processing is executed in step S25, it returns to step S21. Thus, in the case where it is determined that the home table interferes with the partner table upon moving to the moving target coordinate $Y_{1N}$, acquisition of information related to the partner table in steps S21 to S23, determination on whether or not there would be interference in step S24, and the interference avoidance processing in step S25 are performed repeatedly.

In the case where it is determined that there would not be interference in step S24, or in the case where it is determined that there would not be interference in step S24 as a result the interference avoidance processing in step S25, it proceeds to step S26 to start the Y-axis movement of the home table toward the moving target coordinate $Y_{1N}$.

In a manner described above, the Y-axis movement (Y-direction movement) of the substrate working tables 20a and 20b is performed.

In the first embodiment, as described above, accurate position information related to the substrate working tables 20a and 20b can be acquired, since the table recognition mark 24 provided to each of the substrate working tables 20a and 20b is imaged and recognized by the substrate recognition camera 34a (or 34b) coupled and fixed to the base 10. Since the arithmetic processing unit 81 determines whether or not the substrate working tables 20a and 20b interfere with each other based on such accurate position information, whether or not the substrate working tables 20a and 20b mutually interfere at the time of movement can be determined accurately.

In the first embodiment, the image recognition is performed by the image processing unit 84. In the case where the coordinate value (coordinate value based on encoder output) and the actual position of the substrate working table 20a or 20b differ, the arithmetic processing unit 81 corrects the Y-coordinate value of the substrate working table 20a or 20b by the amount of position displacement acquired by the image recognition, and acquires the accurate position coordinate $Y_{1B}$ or $Y_{2B}$ of the substrate working table 20a or 20b, i.e., the position coordinate $Y_{1B}$ or $Y_{2B}$ in which the center of imaging by the substrate recognition camera 34a or 34b and the position of the table recognition mark 24 match in the Y-direction. Thus, based on the accurate position coordinates $Y_{1B}$ and $Y_{2B}$, the arithmetic processing unit 81 can easily and accurately determine whether or not the substrate working tables 20a and 20b interfere with each other and perform the operation control of avoiding interference.

In the first embodiment, the arithmetic processing unit 81 calculates the interference reference distance $L_i$ based on the position coordinates $Y_{1B}$ and $Y_{2B}$ of the substrate working tables 20a and 20b and the minimum interval $L_m$. By comparing, for example, the sum of the moving target coordinate $Y_{1N}$ of one substrate working table (the substrate working table 20a) and the position coordinate (the current coordinate $Y_{2C}$ or the moving target coordinate $Y_{2N}$) of the substrate working table on the other side (substrate working table 20b) and the interference reference distance $L_i$, the arithmetic processing unit 81 determines whether or not the substrate working tables 20a and 20b interfere with each other. Thus, at the time of movement of the substrate working table 20a or 20b, whether or not the substrate working tables 20a and 20b mutually interfere can be determined easily by merely comparing the interference reference distance $L_i$ in which approaching is possible up to the minimum interval $L_m$ and the position coordinate (moving target coordinate or current coordinate) of each table.

In the first embodiment, the arithmetic processing unit 81 carries out the recognition of the table recognition mark 24 by the substrate recognition camera 34a (or 34b) repeatedly at a predetermined timing (upon lapse of every predetermined time or upon completing printing of every predetermined number of print substrates 5) during the work by the printing device 100, and accordingly updates (corrects) the interference reference distance $L_i$. Thus, even in the case where a position displacement occurs in the substrate working tables 20a and 20b due to thermal expansion or contraction over time or the like in the driving mechanism (such as the threaded shaft 12a or 12b) of the substrate working table 20a or 20b, whether or not the substrate working tables 20a and 20b mutually interfere can be determined appropriately.

In the first embodiment, the table recognition mark 24 is provided on the respective substrate working tables 20a and 20b so that imaging is possible by the substrate recognition cameras 34a and 34b provided in a fixed manner in a predetermined position of the beam unit 32 of the frame structure 30, and the table recognition mark 24 of the substrate working tables 20a and 20b is imaged and recognized using the substrate recognition camera 34a (or 34b) for recognizing the print substrate 5 to acquire the position coordinates $Y_{1B}$ and $Y_{2B}$ of the substrate working tables 20a and 20b. Therefore, it is not necessary to separately provide a dedicated imaging unit for acquiring the position coordinates $Y_{1B}$ and $Y_{2B}$ of the substrate working tables 20a and 20b. Thus, whether or not the substrate working tables 20a and 20b mutually interfere at the time of movement can be determined accurately without complicating the configuration of the printing device 100.

Since the table recognition mark 24 for position recognition by the substrate recognition camera 34a (or 34b) is provided as the indicator as described above in the first embodiment, the image recognition of the indicator can be performed more reliably and precisely compared to a case where, for example, the image recognition is performed with a predetermined segment within the printing device 100 as an indication (indicator).

Second Embodiment

Next, referring to FIG. 15, a printing device 100a according to a second embodiment of the present disclosure will be described. In the second embodiment, an example of acquiring the position coordinates $Y_{1B}$ and $Y_{2B}$ of the substrate working tables 20a and 20b using both of the substrate recognition cameras 34a and 34b will be described. Since the device configuration of the printing device 100a according to the second embodiment is similar to that of the printing device 100 of the first embodiment, a description is omitted. In the second embodiment, the table recognition mark 24 of the substrate working table 20a is one example of an "indicator (first indicator)" and "mark" of the present disclosure, and the table recognition mark 24 of the substrate working table 20b is one example of an "indicator (second indicator)" and "mark" of the present disclosure. The substrate recognition camera 34a is one example of an "imaging unit (first substrate recognition camera)" of the present disclosure, and the substrate recognition camera 34b is one example of an "imaging unit (second substrate recognition camera)" of the present disclosure.

Figure 15:
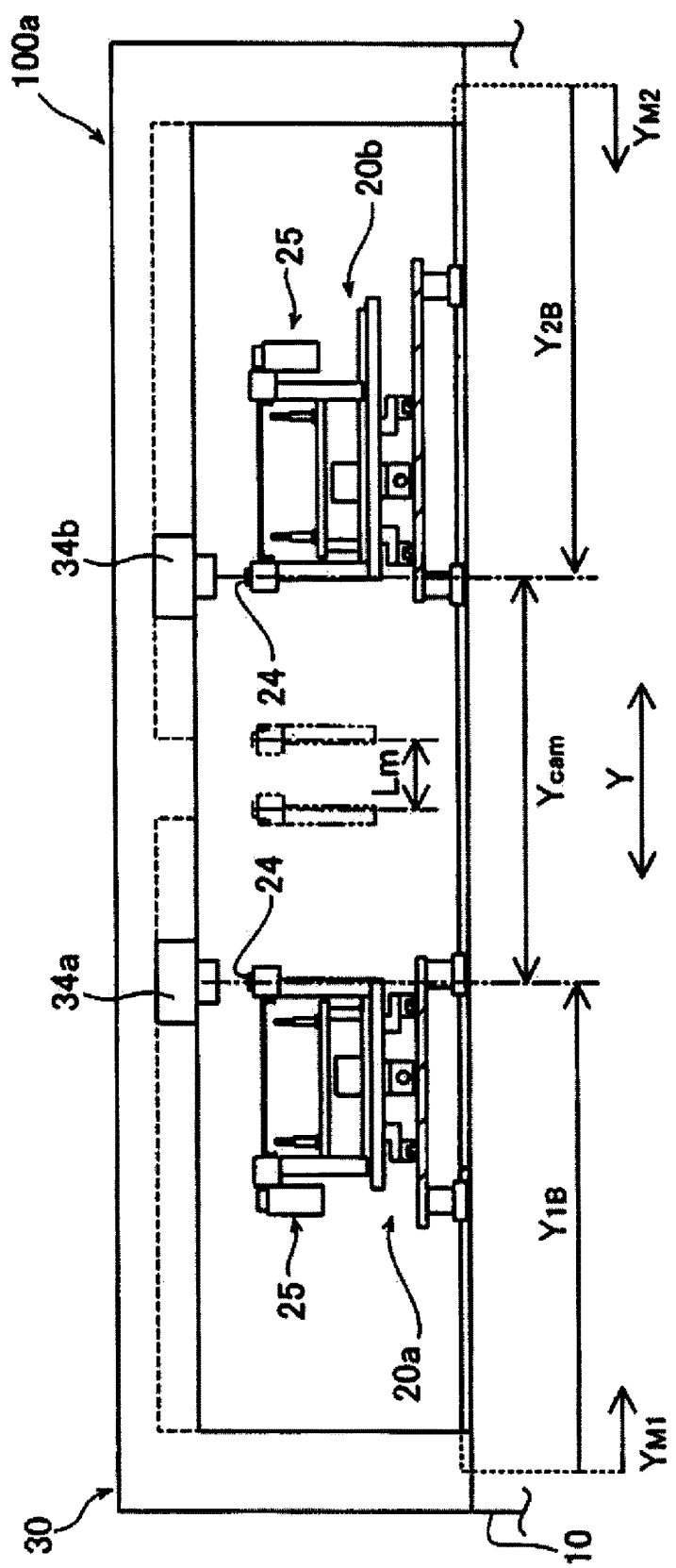
FIG. 15 is a schematic view for illustrating an interference reference distance of substrate working tables in a printing device according to a second embodiment of the present disclosure.

Since the two substrate recognition cameras 34a and 34b are provided in a fixed manner to the beam unit 32 of the frame structure 30 as described above, the interval (distance in the Y-direction) between the two substrate recognition cameras 34a and 34b is calculated from a measured or design value and stored in the control data storage unit 82b in advance as $Y_{cam}$ in the second embodiment, as shown in FIG. 15.

Regarding the setting of the interference reference distance $L_i$, in the second embodiment, the substrate working table 20a is moved to position the table recognition mark 24 below the substrate recognition camera 34a, and the table recognition mark 24 is imaged with the substrate recognition camera 34a in this state to perform image recognition thereof. Based on the image recognition result, the actual position coordinate $Y_{1B}$ when the center of imaging by the substrate recognition camera 34a and the position of the table recognition mark 24 match in the Y-direction is obtained, and the position coordinate $Y_{1B}$ is stored in the control data storage unit 82b.

Similarly, the substrate working table 20b is moved to position the table recognition mark 24 below the substrate recognition camera 34b, and the table recognition mark 24 is imaged with the substrate recognition camera 34b in this state to perform image recognition thereof. Based on the image recognition result, the actual position coordinate $Y_{2B}$ when the center of imaging by the substrate recognition camera 34b and the position of the table recognition mark 24 match in the Y-direction is obtained, and the position coordinate $Y_{2B}$ is stored in the control data storage unit 82b. The minimum interval $L_m$ is stored in the control data storage unit 82b in a similar manner to the first embodiment.

Using the four parameters ($Y_{1B}$, $Y_{2B}$, $L_m$, and $Y_{cam}$) above, the interference reference distance $L_i$ similar to that in the first embodiment is set with the following formula.

$$Y_{1B}+Y_{2B}+Y_{cam}-L_m=L_i \text{(interference reference distance)}$$

Accordingly, the control device 80 (arithmetic processing unit 81) determines the presence or absence of interference by the substrate working tables 20a and 20b using the interference reference distance $L_i$. It is possible to perform the details of determination on the presence or absence of interference and the operation control of the printing device 100 by the control device 80 (arithmetic processing unit 81) in a similar manner to the first embodiment.

In the second embodiment, as described above, the accurate position coordinates $Y_{1B}$ and $Y_{2B}$ of the substrate working tables 20a and 20b can be acquired by recognizing the table recognition mark 24 of the respective substrate working tables 20a and 20b with the corresponding substrate recognition cameras 34a and 34b. Based on the acquired position coordinates $Y_{1B}$ and $Y_{2B}$ and the interval $Y_{cam}$ between the substrate recognition cameras 34a and 34b, the arithmetic processing unit 81 determines whether or not the substrate working tables 20a and 20b interfere at the time of movement. Since the acquired position coordinates $Y_{1B}$ and $Y_{2B}$ are accurate as described above, whether or not the substrate working tables 20a and 20b mutually interfere can be determined accurately.

Since it is not necessary to move the substrate working tables 20a and 20b to the same position of the substrate recognition camera 34a in the second embodiment as in the first embodiment, the position coordinates $Y_{1B}$ and $Y_{2B}$ of the substrate working tables 20a and 20b can be acquired more easily and promptly.

Other effects of the second embodiment are similar to the effects in the first embodiment.

Third Embodiment

Next, referring to FIG. 16 and FIG. 17, a printing device 100b according to a third embodiment of the present disclosure will be described. In the third embodiment, an example of acquiring the position coordinate of the substrate working tables 20a and 20b using the mask recognition camera 25 of the substrate working tables 20a and 20b will be described.

Figure 16:
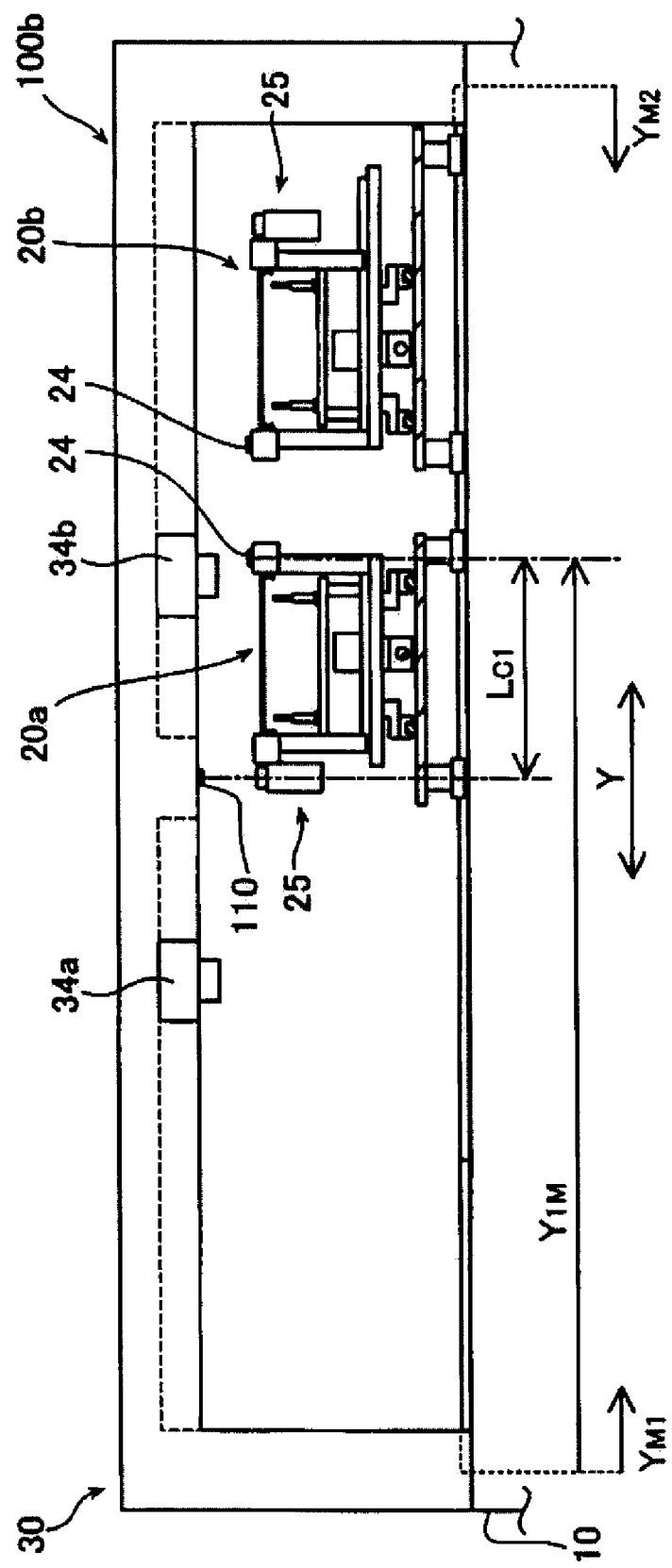
FIG. 16 is a schematic view for illustrating a method of acquiring a position coordinate of a substrate working table in a printing device according to a third embodiment of the present disclosure.

In the third embodiment, as shown in FIG. 16, a position recognition mark 110 for position recognition of the substrate working tables 20a and 20b is provided in a fixed manner on the lower surface of the frame structure 30 on the upstream side of the substrate feed direction (X-direction) so that recognition is possible by the mask recognition camera 25. Thus, the position recognition mark 110 is coupled and fixed to the base 10 via the frame structure 30. The position recognition mark 110 is arranged in the middle position of the printing device 100b in the Y-direction. In the third embodiment, the position recognition mark 110 is one example of an "indicator" and "mark" of the present disclosure. The mask recognition camera 25 of the substrate working table 20a is one example of an "imaging unit (first mask recognition camera)" of the present disclosure, and the mask recognition camera 25 of the substrate working table 20b is one example of an "imaging unit (second mask recognition camera)" of the present disclosure.

Other configurations of the third embodiment are similar to the configurations in the first and second embodiments.

Next, acquisition of the position coordinates of the substrate working tables 20a and 20b and setting of the interference reference distance according to the third embodiment will be described.

Figure 17:
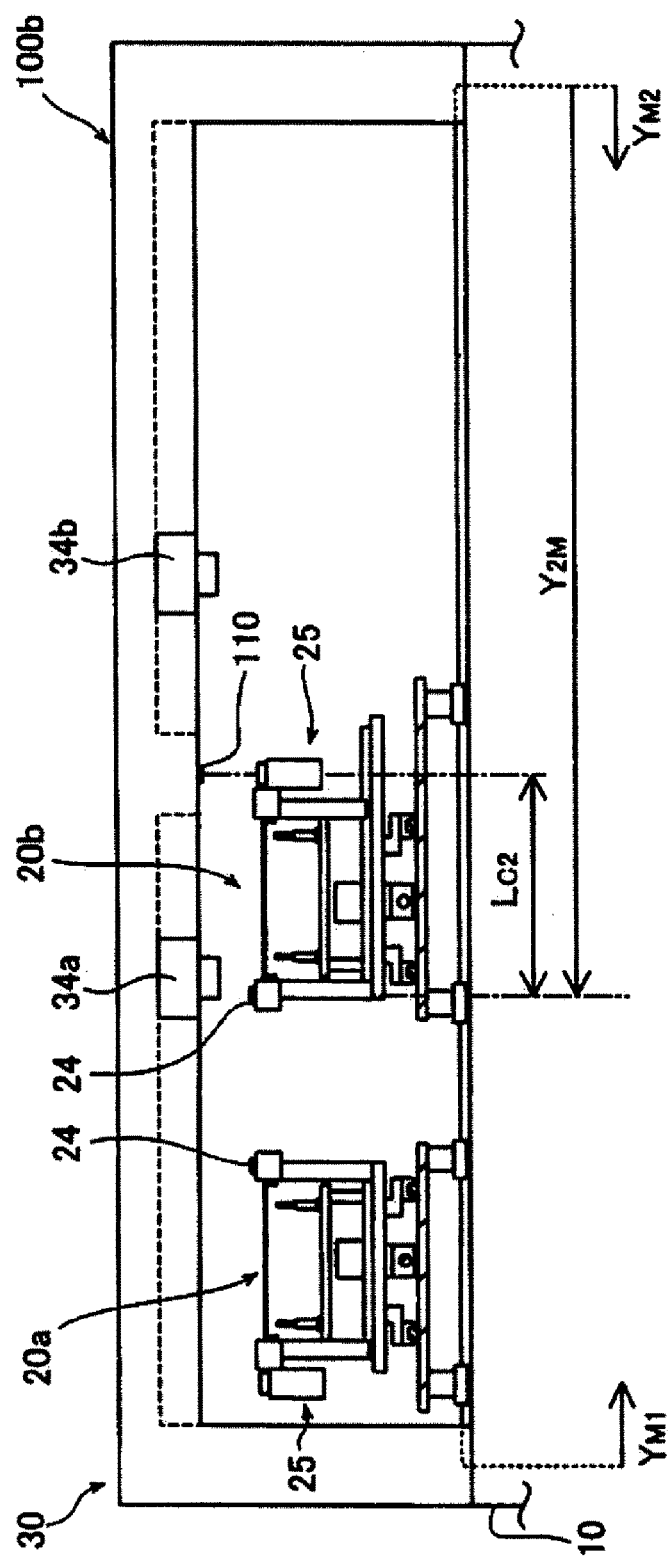
FIG. 17 is a schematic view for illustrating the method of acquiring a position coordinate of the substrate working table in the printing device according to the third embodiment of the present disclosure.

In the third embodiment, as shown in FIG. 16 and FIG. 17, the distance between the mask recognition camera 25 and the table recognition mark 24 in the Y-direction is first calculated from a measured or design value and stored in the control data storage unit 82b in advance as $L_{C1}$ and $L_{C2}$ in the respective substrate working tables 20a and 20b.

As shown in FIG. 16, the substrate working table 20a is moved to position the mask recognition camera 25 below the position recognition mark 110, and the position recognition mark 110 is imaged with the mask recognition camera 25 in this state to perform image recognition thereof. Based on the image recognition result, an actual position coordinate $Y_{1M}$ (distance to a table recognition mark 24a from an origin, the origin being set in a similar manner to the first embodiment) of the substrate working table 20a when the center of imaging by the mask recognition camera 25 and the position of the position recognition mark 110 match in the Y-direction is obtained, and the position coordinate $Y_{1M}$ is stored in the control data storage unit 82b.

Similarly, as shown in FIG. 17, the substrate working table 20b is moved to position the mask recognition camera 25 below the position recognition mark 110, and the position recognition mark 110 is imaged with the mask recognition camera 25 in this state to perform image recognition thereof. Based on the image recognition result, an actual position coordinate $Y_{2M}$ of the substrate working table 20b when the center of imaging by the mask recognition camera 25 and the position of the position recognition mark 110 match in the Y-direction is obtained, and the position coordinate $Y_{2M}$ is stored in the control data storage unit 82b. The minimum interval $L_m$ is stored in the control data storage unit 82b in a similar manner to the first embodiment.

Using the five parameters ($Y_{1M}$, $Y_{2M}$, $L_m$, $L_{C1}$, and $L_{C2}$) above, the interference reference distance $L_i$ similar to that in the first embodiment is set with the following formula.

$$(Y_{1M}-L_{C1})+(Y_{2M}-L_{C2})-L_m=L_i \text{(interference reference distance)}$$

Accordingly, the control device 80 (arithmetic processing unit 81) determines the presence or absence of interference by the substrate working table 20a and the substrate working table 20b using the interference reference distance $L_i$. It is possible to perform the details of determination on the presence or absence of interference and the operation control of the printing device 100b by the control device 80 (arithmetic processing unit 81) in a similar manner to the first embodiment.

In the third embodiment, as described above, accurate position information related to the substrate working tables 20a and 20b can be acquired by recognizing the position recognition mark 110 with the mask recognition camera 25 for each of the substrate working tables 20a and 20b. The arithmetic processing unit 81 determines whether or not the substrate working tables 20a and 20b mutually interfere at the time of movement based on the acquired position coordinates $Y_{1M}$ and $Y_{2M}$. Since the acquired position coordinates $Y_{1M}$ and $Y_{2M}$ are accurate as described above, whether or not the substrate working tables 20a and 20b mutually interfere can be determined accurately.

In the third embodiment, as described above, the position coordinates $Y_{1M}$ and $Y_{2M}$ of the substrate working tables 20a and 20b can be acquired using the mask recognition camera 25 for recognizing the screen mask 6. Therefore, is not necessary to separately provide a dedicated imaging unit, and thus complication in the device configuration of the printing device 100b can be prevented.

Other effects of the third embodiment are similar to the effects in the first embodiment.

Fourth Embodiment

Next, referring to FIG. 18, a printing device 100c according to a fourth embodiment of the present disclosure will be described. In the fourth embodiment, unlike in the third embodiment, an example in which two position recognition marks 110a and 110b corresponding to the substrate working tables 20a and 20b are imaged to acquire the position coordinates of the substrate working tables 20a and 20b will be described. In the fourth embodiment, the position recognition mark 110a is one example of an "indicator (first indicator)" and "mark" of the present disclosure, and the position recognition mark 110b is one example of an "indicator (second indicator)" and "mark" of the present disclosure. The mask recognition camera 25 of the substrate working table 20a is one example of an "imaging unit (first mask recognition camera)" of the present disclosure, and the mask recognition camera 25 of the substrate working table 20b is one example of an "imaging unit (second mask recognition camera)" of the present disclosure.

Figure 18:
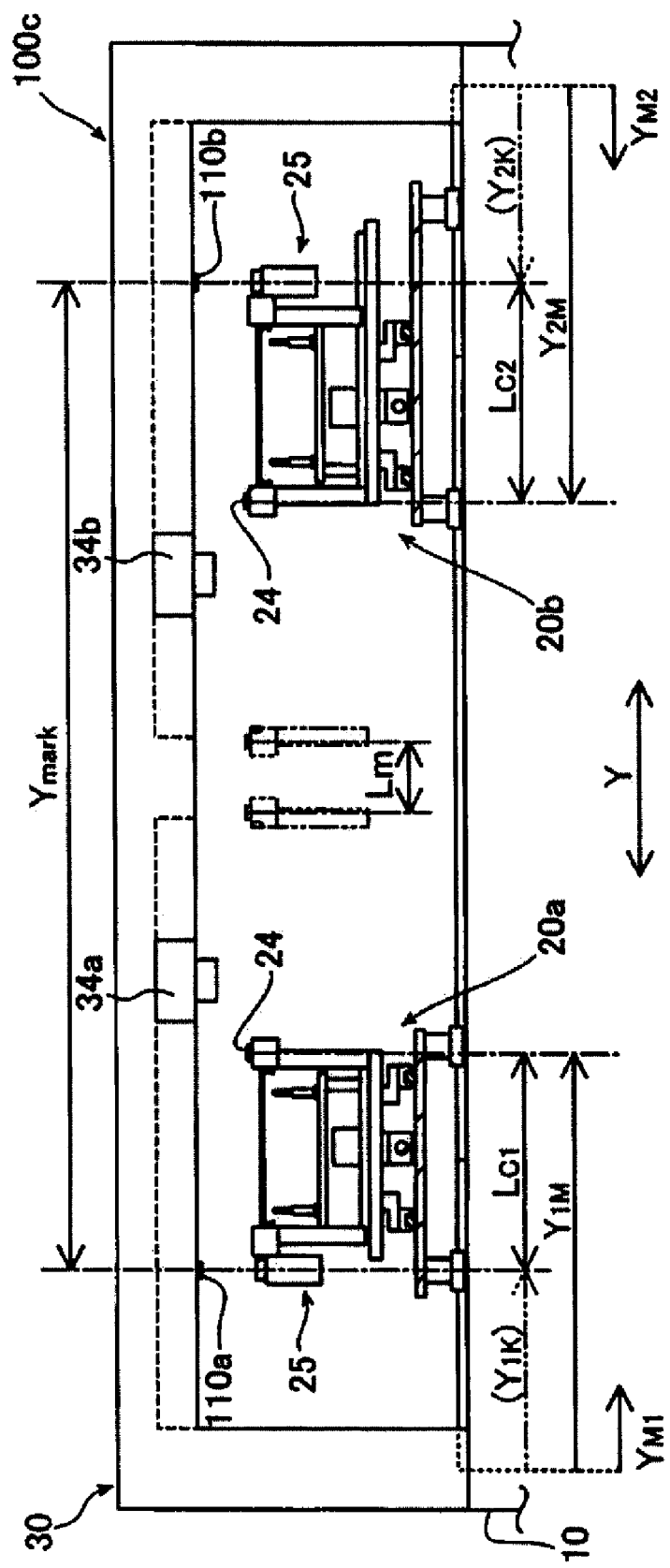
FIG. 18 is a schematic view for illustrating an interference reference distance of substrate working tables in a printing device according to a fourth embodiment of the present disclosure.

In the fourth embodiment, as shown in FIG. 18, the position recognition marks 110a and 110b recognizable by the mask recognition camera 25 are provided in a fixed manner to the lower surface of the frame structure 30 on the upstream side in the substrate feed direction (X-direction) to respectively correspond to the substrate working tables 20a and 20b. The position recognition marks 110a and 110b are arranged in a position such that imaging is possible by the mask recognition camera 25 of the corresponding substrate working tables 20a and 20b. The interval between the two position recognition marks 110a and 110b is $Y_{mark}$.

Other configurations of the fourth embodiment are similar to the configurations in the third embodiment.

Next, acquisition of the position coordinates of the substrate working tables 20a and 20b and setting of the interference reference distance according to the fourth embodiment will be described.

In the fourth embodiment, the substrate working table 20a is moved to position the mask recognition camera 25 below the position recognition mark 110a, and the position recognition mark 110a is imaged with the mask recognition camera 25 in this state to perform image recognition thereof. Based on the image recognition result, the position coordinate $Y_{1M}$ of the substrate working table 20a when the center of imaging by the mask recognition camera 25 and the position of the position recognition mark 110a match in the Y-direction is obtained, and the position coordinate $Y_{1M}$ is stored in the control data storage unit 82b.

Similarly, the substrate working table 20b is moved to position the mask recognition camera 25 below the position recognition mark 110b, and the position recognition mark 110b is imaged with the mask recognition camera 25 in this state to perform image recognition thereof. Based on the image recognition result, the position coordinate $Y_{2M}$ of the substrate working table 20b when the center of imaging by the mask recognition camera 25 and the position of the position recognition mark 110b match in the Y-direction is obtained, and the position coordinate $Y_{2M}$ is stored in the control data storage unit 82b.

In the fourth embodiment, the distance $Y_{mark}$ between the position recognition marks 110a and 110b is acquired in advance and stored in the control data storage unit 82b. The minimum interval $L_m$ and the distances $L_{C1}$ and $L_{C2}$ between the mask recognition camera 25 and the table recognition mark 24 in the Y-direction are stored in the control data storage unit 82b in a similar manner to the third embodiment.

Using the six parameters ($Y_{1M}$, $Y_{2M}$, $L_m$, $L_{C1}$, $L_{C2}$, and $Y_{mark}$) above, the interference reference distance $L_i$ similar to that in the third embodiment can be set with the following formula.

$$(Y_{1M}-L_{C1})+(Y_{2M}-L_{C2})+Y_{mark}-L_m=L_i \text{(interference reference distance)}$$

Accordingly, it is possible for the control device 80 (arithmetic processing unit 81) to determine the presence or absence of interference by the substrate working tables 20a and 20b using the interference reference distance $L_i$. It is possible to perform the details of determination on the presence or absence of interference and the operation control of the printing device 100c by the control device 80 (arithmetic processing unit 81) in a similar manner to the first embodiment.

In the fourth embodiment, as described above, the arithmetic processing unit 81 is configured to determine whether or not the substrate working tables 20a and 20b interfere at the time of movement, based on the position coordinates $Y_{1M}$ and $Y_{2M}$ obtained by recognizing the corresponding position recognition marks 110a and 110b with the mask recognition cameras 25 of the respective substrate working tables 20a and 20b and the interval $Y_{mark}$ between the position recognition marks 110a and 110b. Thus, compared to a case where a single position recognition mark is recognized by each mask recognition camera 25, the position coordinates $Y_{1M}$ and $Y_{2M}$ of the substrate working tables 20a and 20b can be acquired easily and promptly, since it is not necessary to move the substrate working tables 20a and 20b to a position of a common (single) position recognition mark.

Other effects of the fourth embodiment are similar to the effects in the third embodiment.

The embodiment disclosed herein should be taken as an exemplification in all points and not limiting. The scope of the present disclosure is shown not by the description of the embodiments described above but by the scope of claims, and further includes meanings equivalent to the scope of the claims and all changes within that scope.

For example, in the first to fourth embodiments, an example of applying the printing device 100 (100a to 100c) that performs solder printing work with respect to a print substrate to the present disclosure has been shown as one example of the substrate working device of the present disclosure. However, the present disclosure is not as such. For example, the present disclosure may be applied to a surface mounting machine 200 (see FIG. 19) that performs part mounting work with respect to a print substrate or an inspection device 300 (see FIG. 20) that performs appearance inspection work for a part on a print substrate. The surface mounting machine 200 and the inspection device 300 are each one example of a "substrate working device" of the present disclosure.

Figure 19:
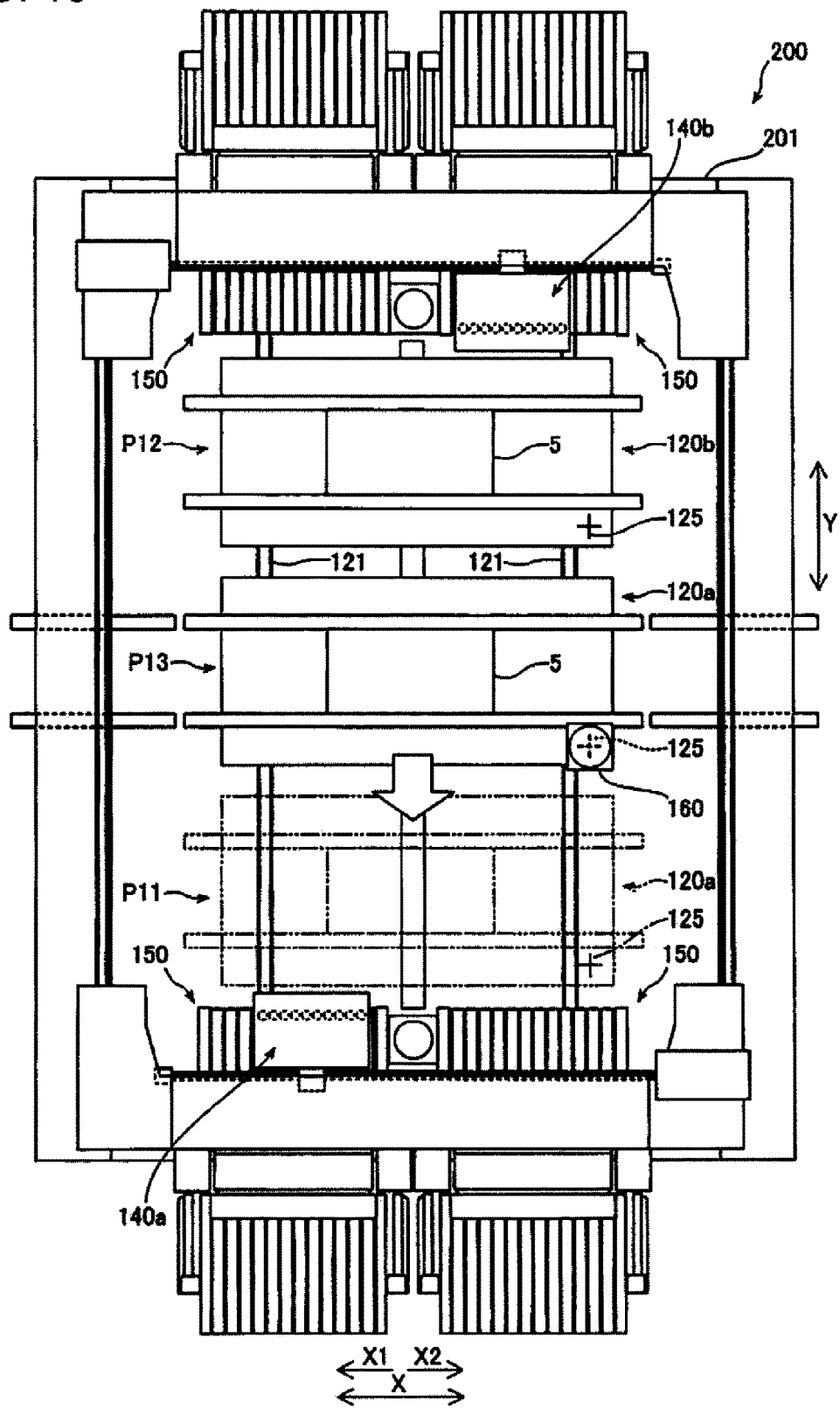
FIG. 19 is a schematic view showing a surface mounting machine according to a first modification example of the first to fourth embodiments of the present disclosure.

As a specific example (first modification example), the surface mounting machine 200 is shown in FIG. 19. The surface mounting machine 200 includes a base 201, two substrate working tables 120a and 120b aligned in the Y-direction, and head units 140a and 140b respectively corresponding to the substrate working tables 120a and 120b. The substrate working table 120a is one example of a "first substrate working table" of the present disclosure, and the substrate working table 120b is one example of a "second substrate working table" of the present disclosure.

The head units 140a and 140b are respectively movable above the respective substrate working tables 120a and 120b in the X- and Y-directions to take out a part from a part supply unit 150 and mount the part to the print substrate 5 held by the substrate working table 120a or 120b. The substrate working tables 120a and 120b are movable on a common guide rail 121 respectively in the Y-direction. Of the substrate working tables 120a and 120b, the substrate working table 120a on one side is movable across a mounting work position P11 in which mounting work for the print substrate 5 is performed and a loading/unloading position P13 in the middle of the base 201 in the Y-direction, and the substrate working table 120b on another side is movable across a mounting work position P12 in which mounting work for the print substrate 5 is performed and the loading/unloading position P13. The loading/unloading position P13 is a position where introduction and discharge of the print substrate 5 with respect to the substrate working tables 120a and 120b are performed. In a corner portion (lower right corner in the drawing) on the upper surface of the respective substrate working tables 120a and 120b, a table recognition mark 125 is provided. In a position above the substrate working tables 120a and 120b, a mark recognition camera 160 for recognizing the table recognition mark 125 is provided with the imaging direction directed downward (to the substrate working table side). The mark recognition camera 160 is coupled and fixed to the base 201 via a frame that is not shown. The table recognition mark 125 is one example of an "indicator" and "mark" of the present disclosure, and the mark recognition camera 160 is one example of an "imaging unit" of the present disclosure.

Accordingly, by the table recognition mark 125 of the substrate working tables 120a and 120b being positioned and imaged in a position below the mark recognition camera 160, the position information (Y-axis position coordinate) of the substrate working tables 120a and 120b can be acquired. FIG. 19 shows a state where the table recognition mark 125 of the substrate working table 120a is positioned in the position below the mark recognition camera 160. With the surface mounting machine 200 according to the first modification example, it is possible to set the interference reference distance $L_i$ in a similar manner to the first embodiment, and whether or not the substrate working tables 120a and 120b interfere with each other can be determined based on the interference reference distance $L_i$.

Figure 20:
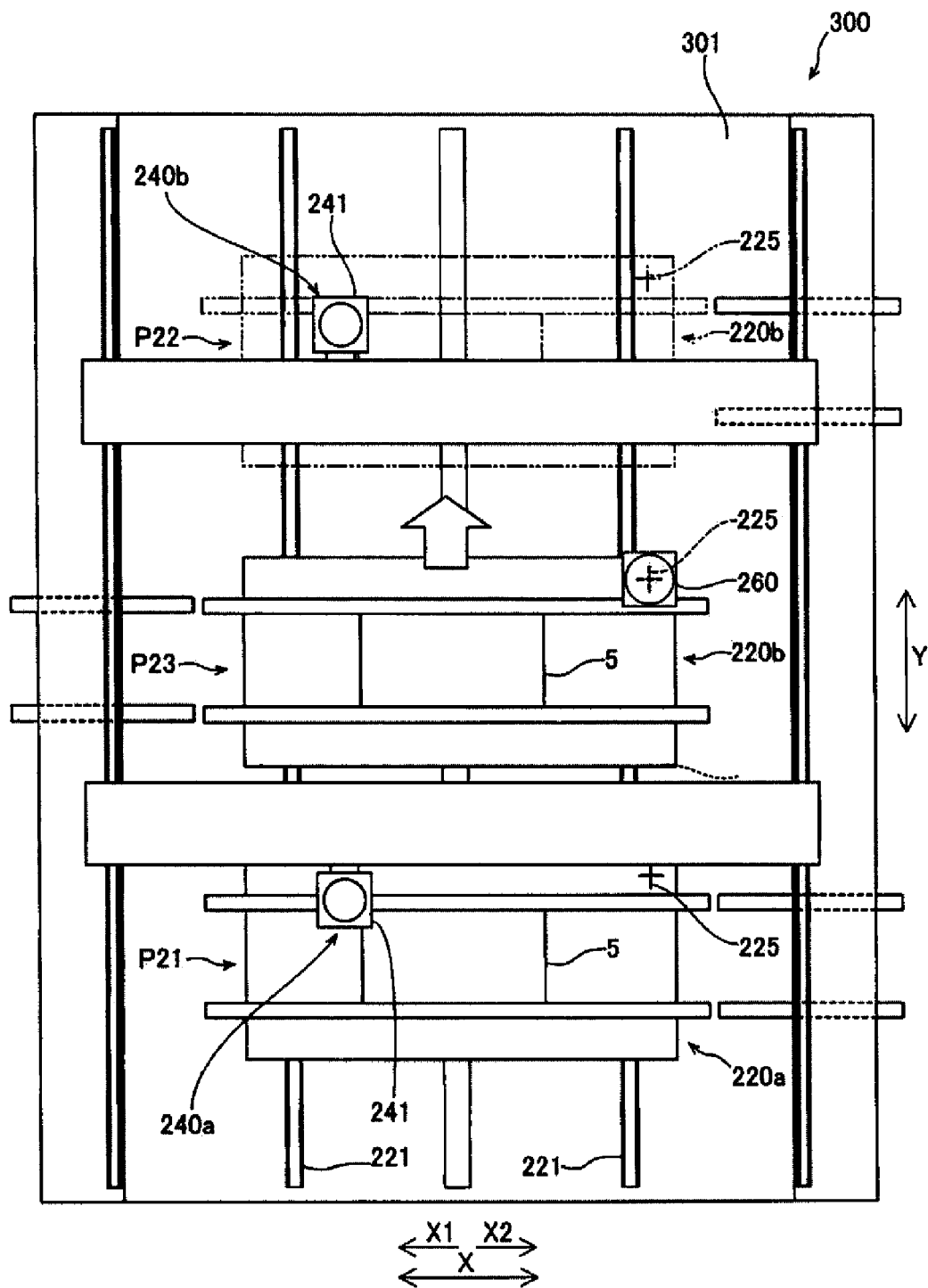
FIG. 20 is a schematic view showing an inspection device according to a second modification example of the first to fourth embodiments of the present disclosure.

FIG. 20 shows the inspection device 300 as another specific example (second modification example). The inspection device 300 includes a base 301, two substrate working tables 220a and 220b aligned in the Y-direction, and inspection heads 240a and 240b respectively corresponding to the substrate working tables 220a and 220b. The substrate working table 220a is one example of a "first substrate working table" of the present disclosure, and the substrate working table 220b is one example of a "second substrate working table" of the present disclosure.

The inspection heads 240a and 240b respectively include an inspection camera 241 movable in the X-direction, and image a substrate while moving the inspection camera 241 in the X-direction in synchronization with the Y-direction movement of the substrate working tables 220a and 220b. Accordingly, the inspection device 300 performs the appearance inspection work for the print substrate 5. The substrate working tables 220a and 220b are respectively movable in the Y-direction on a common guide rail 221. The substrate working table 220a on one side accepts the print substrate 5 in an inspection work/entrance position P21 on one end side in the Y-direction, and performs discharge of the print substrate 5 in an exit position P23 in the middle in the Y-direction. The substrate working table 220b on another side accepts the print substrate 5 in an inspection work/ entrance position P22 on another side in the Y-direction, and performs discharging of the print substrate 5 in the exit position P23. In the corner portion (upper right corner in the drawing) on the upper surface of the respective substrate working tables 220a and 220b, a table recognition mark 225 is provided. In a position above the substrate working tables 220a and 220b, a mark recognition camera 260 for recognizing the table recognition mark 225 is provided with the imaging direction directed downward (to the substrate working table side). The mark recognition camera 260 is coupled and fixed to the base 301 via a frame that is not shown. The table recognition mark 225 is one example of an "indicator" and "mark" of the present disclosure, and the mark recognition camera 260 is one example of an "imaging unit" of the present disclosure.

Accordingly, by the table recognition mark 225 of the substrate working tables 220a and 220b being positioned and imaged in a position below the mark recognition camera 260, it is possible to acquire the position information (Y-axis position coordinate) of the substrate working tables 220a and 220b. With the inspection device 300 according to the second modification example, it is possible to set the interference reference distance $L_i$ in a similar manner to the first embodiment, and whether or not the substrate working tables 220a and 220b interfere with each other can be determined based on the interference reference distance $L_i$.

In the first and second embodiments, an example in which the table recognition mark 24 is provided to the upper surface of the arm unit 52a (clamp unit 53a) on the fixed side of the substrate working table 20a (20b) and imaged with the substrate recognition camera 34a (34b) has been shown. However, the present disclosure is not limited as such. As in the first modification example or the second modification example, the configuration may be such that a table recognition mark is provided to a portion other than an arm unit of a substrate working table, and a dedicated mark recognition camera is provided to image the table recognition mark.

In the first and second embodiments, an example in which the substrate recognition cameras 34a and 34b are provided in a fixed manner to the frame structure 30 has been shown. In the third and fourth embodiments, an example in which the position recognition mark 110 (110a and 110b) is provided in a fixed manner to the frame structure 30 has been shown. However, the present disclosure is not limited as such. The substrate recognition camera 34a or 34b or the position recognition mark 110 (110a and 110b) may be installed in a place other than the frame structure 30.

In the first embodiment, an example in which the presence or absence of interference is determined based on the magnitude relationship of the sum of the Y-coordinate ($Y_{1C}$ or $Y_{1N}$) of the substrate working table 20a and the Y-coordinate ($Y_{2C}$ or $Y_{2N}$) of the substrate working table 20b and the interference reference distance $L_i$ has been shown. However, the present disclosure is not limited as such. For example, it may be such that, at the time of movement, the interval between the substrate working tables 20a and 20b is calculated from the Y-coordinate ($Y_{1C}$ or $Y_{1N}$) of the substrate working table 20a and the Y-coordinate ($Y_{2C}$ or $Y_{2N}$) of the substrate working table 20b, and the interval is compared with the minimum interval $L_m$ to determine the presence or absence of interference.

In the first to fourth embodiments, an example in which the position coordinate of the table recognition mark 24 provided to the respective substrate working tables 20a and 20b is used as the position reference of the substrate working tables 20a and 20b has been shown. However, the present disclosure is not limited as such. A position coordinate other than for the table recognition mark 24 may be used for the position reference of the substrate working tables 20a and 20b.

Figure 21:
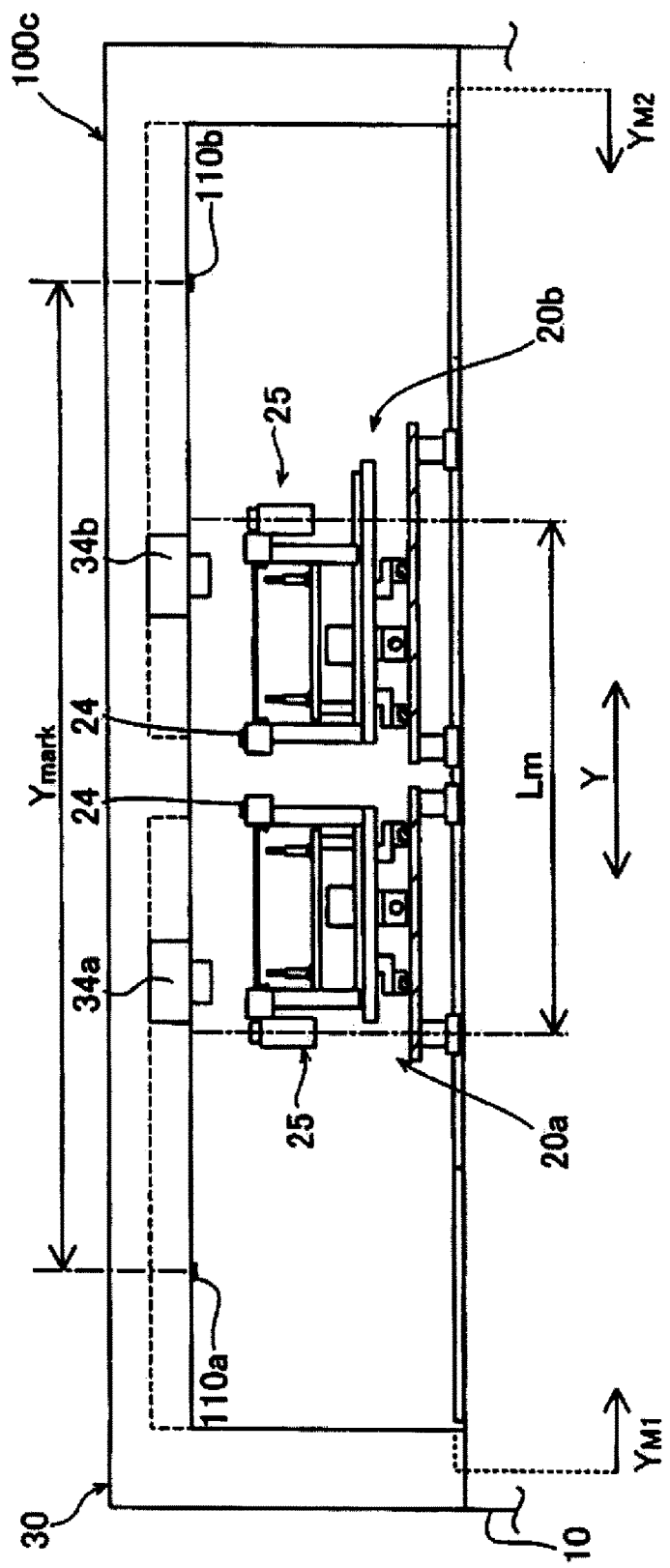
FIG. 21 is a schematic view for illustrating a minimum interval between substrate working tables according to a modification example of the first to fourth embodiments of the present disclosure.

For example, as shown with a parenthesis in FIG. 18, position coordinates $Y_{1K}$ and $Y_{2K}$ of the mask recognition cameras 25 may be set as the position reference of the substrate working tables 20a and 20b. The distance between the mask recognition cameras 25 in a state where the substrate working table 20a and the substrate working table 20b are closest without interference is the minimum interval $L_m$ (see FIG. 21). As a result, it is possible to define the following value as the interference reference distance $L_i$.

$$Y_{1K} + Y_{2K} + Y_{mark} - L_m = L_i \text{(interference reference distance)}$$

Thus, in this case, it is not necessary to use the distances $L_{C1}$ and $L_{C2}$ between the mask recognition camera 25 and the table recognition mark 24 in the Y-direction used in the fourth embodiment.

In the first to fourth embodiments, an example in which a mark (the table recognition mark 24 or the position recognition mark 110, 110a, or 110b) for position recognition is imaged for image recognition has been described. However, the present disclosure is not limited as such. In the present disclosure, a predetermined segment within a device may be imaged to acquire position information, as long as image recognition by an imaging unit is possible. For example, the configuration may be such that an end portion of the clamp unit 53a is imaged, instead of providing the table recognition mark 24 to the upper surface of the arm unit 52a (clamp unit 53a).

In the first embodiment, an example in which the substrate working tables 20a and 20b have common moving regions (overlapping moving ranges) has been shown. However, the present disclosure is not limited as such. The substrate working tables 20a and 20b may have separate moving regions that do not overlap. In such cases, there is a possibility of mutual interference, if the configuration is such that the substrate working tables 20a and 20b is movable to a position close to each other. Therefore, there is meaning in applying the present disclosure.

In the first embodiment, an example of performing the recognition of the table recognition mark by the substrate recognition camera at a predetermined timing, specifically, control of repetition upon lapse of every predetermined time or upon completing printing of every predetermined number of the print substrates 5, has been shown. However, the present disclosure is not limited as such. For example, a temperature sensor may be provided in a predetermined position within a device to assume, as such predetermined timing, a timing upon a predetermined or greater change in the temperature detected by the temperature sensor at the time of work.

In the first to fourth embodiments, an example of a configuration in which the two printing work units 40a and 40b are provided and solder printing work is executed in the corresponding two printing positions P1 and P2 has been shown. However, the present disclosure shown in not limited as such. For example, the configuration may be such that one printing work unit is provided in the middle in the Y-direction (exit position), and the printing work is performed with the common printing work unit in the printing position in the middle with respect to each print substrate held by the substrate working tables 20a and 20b.

In the first to fourth embodiments, an example in which the two printing work units 40a and 40b are provided and each performs printing of a print substrate separately has been shown. However, the present disclosure is not limited as such. For example, there are cases where solder printing is performed using two screen masks with respect to one print substrate. In this case, the configuration may be such that a screen mask for first-time printing and a screen mask for a second-time printing are arranged in two printing work units, and the substrate working tables 20a and 20b respectively move to the printing work units in two places to perform printing work. In this case, it suffices to arrange the two printing work units in a position toward the middle in the Y-axis direction, in consideration of the moving range of the substrate working table.

In the first to fourth embodiments, an example of the printing device that performs substrate discharging in the two exit positions Ex1 and Ex2 in correspondence with the dual-feed surface mounting machine M has been shown. However, the present disclosure is not limited as such. For example, the configuration may be such that a printed print substrate is discharged from one exit position in the middle in the Y-direction in correspondence with a single-feed surface mounting machine.

In the first to fourth embodiments, an example in which the interference determination and the interference avoidance processing are performed using the current coordinates $Y_{1C}$ and $Y_{2C}$ and the moving target coordinates $Y_{1N}$ and $Y_{2N}$ for the Y-coordinates of the substrate working tables 20a and 20b has been shown. However, the present disclosure is not limited as such. For example, the configuration may be such that real-time interference avoidance control is performed, in consideration of the moving speed or the like of a substrate working table.

Specifically, even in the case where it is determined that there would be interference from the current coordinate or moving target coordinate of the partner table, control is performed to start the Y-axis movement of the home table and to adjust the moving speed of the partner table and the home table, such that an interval at least greater than the minimum interval $L_m$ is maintained. For example, even if the current coordinate of the partner table is a position coordinate that leads to mutual interference at the time of the start of movement, it is possible to avoid interference by reducing the moving speed of the home table to delay the timing at which the moving target coordinate is reached, in the case where the partner table moves in a departing direction after the start of movement of the home table. In this case, the interval greater than the minimum interval $L_m$ is maintained to avoid mutual interference, if the sum of the position coordinates of the respective tables at the respective time points during movement is smaller than the interference reference distance.

In the first to fourth embodiments, an example in which the table recognition mark 24 is provided to the arm unit 52a on the fixed side of the clamp unit 23 has been shown. However, the present disclosure is not limited as such. In the present disclosure, the table recognition mark 24 may be provided to the arm unit 52b on the movable side. This is because the Y-coordinates of the substrate working tables 20a and 20b can be calculated by obtaining the distance between the arm unit 52b on the movable side and the arm unit 52a on the fixed side in correspondence with the movement of the arm unit 52b on the movable side.

In the first and second embodiments, the table recognition mark 24 provided to the substrate working tables 20a and 20b is imaged by the substrate recognition cameras 34a and 34b installed at the frame structure 30. However, a table recognition mark provided in a different position of the substrate working tables 20a and 20b may be imaged by a camera installed at the base 10 to recognize the table position. In the third and fourth embodiments, the position recognition mark 110 of the substrate working tables 20a and 20b provided to the frame structure 30 is imaged with the mask recognition camera 25 provided to the substrate working tables 20a and 20b. However, it may be such that a position recognition mark of the substrate working tables 20a and 20b installed at the base 10 is imaged by a camera provided in a different position of the substrate working tables 20a and 20b to recognize the table position. Therein, the base 10 is one example of a "base side member" of the present disclosure.

The present disclosure described above is summarized as follows.

A substrate working device according to one aspect of the present disclosure is a substrate working device that performs predetermined work with respect to a substrate, including: a base; a first substrate working table and a second substrate working table movably supported on the base to be able to approach each other in a specific direction; an indicator provided to one of a base side member, which is the base or a member fixed to the base, and the first and second substrate working tables; an imaging unit provided on the other one, which is different from the one, of the base side member and the first and second substrate working tables in order to image the indicator; and a control unit that, by causing the imaging unit to image the indicator and based on image data thereof and position data of one of the indicator and the imaging unit, the one which is provided to the base side member, acquires position information related to each of the substrate working tables, and that moreover determines whether or not the respective substrate working tables interfere with each other at a time of movement of each of the substrate working tables based on the position information.

With the substrate working device, accurate position information related to the first substrate working table and the second substrate working table can be acquired by recognizing the indicator with the imaging unit. Since the control unit is configured to determine whether or not the respective substrate working tables interfere with each other at the time of movement based on such accurate position information, whether or not the substrate working tables mutually interfere can be determined accurately.

In the substrate working device, the position information is a position coordinate of the first substrate working table and the second substrate working table.

With this configuration, an accurate position coordinate of the first substrate working table and the second substrate working table is acquired, and whether or not the respective substrate working tables interfere with each other at the time of movement is determined based on the position coordinate. Thus, even in the case where the actual position of the substrate working table differs from an intended coordinate value (coordinate value used in operation control), whether or not the substrate working tables mutually interfere at the time of movement can be determined easily and accurately to perform operation control of avoiding interference.

In the substrate working device, it is preferable that the control unit calculate, based on the position coordinate of the first substrate working table and the second substrate working table and a minimum interval between the two substrate working tables enabled to approach to each other in the specific direction without interference with each other, an interference reference distance that is a sum of moving distances of the respective substrate working tables when the respective substrate working tables are caused to approach up to a position of the minimum interval from a predetermined origin position, and moreover determine whether or not the substrate working tables interfere with each other by comparing a moving target coordinate or current coordinate of the two substrate working tables and the interference reference distance.

With this configuration, it is possible to determine whether or not the substrate working tables mutually interfere more easily merely by comparing the interference reference distance and the position coordinate (moving target coordinate or current coordinate) of the respective tables at the time of movement of the first substrate working table and the second substrate working table.

In the substrate working table described above, it is preferable that the control unit perform control of repeatedly acquiring the position information by causing the imaging unit to image the indicator at a predetermined timing during the predetermined work.

Even in the case where a position displacement has occurred in the substrate working table due to thermal contraction of a driving mechanism (threaded shaft or the like), the position displacement (change in position information) can be corrected through image recognition with this configuration, since the recognition of the indicator by the imaging unit is repeatedly performed during work. Thus, even in the case where a position displacement occurs in the substrate working table, whether or not the substrate working tables mutually interfere can be determined appropriately.

In the substrate working device according to the one aspect, it is preferable that the imaging unit be a substrate recognition camera that is provided in a fixed manner to the base side member and that recognizes the substrate held by the first substrate working table and the second substrate working table, and the indicator includes a first indicator provided to the first substrate working table in a position where imaging is possible by the substrate recognition camera and a second indicator provided to the second substrate working table in a position where imaging is possible by the substrate recognition camera.

With this configuration, the position information related to the first substrate working table and the second substrate working table can be acquired using the substrate recognition camera for recognizing the substrate at the time of work. Thus, it is possible to accurately determine whether or not the substrate working tables mutually interfere at the time of movement, without causing complications in the device configuration by separately providing a dedicated imaging unit for acquiring the position information related to the substrate working table.

In the substrate working device, it may be such that the substrate recognition camera includes a first substrate recognition camera corresponding to the first substrate working table and a second substrate recognition camera corresponding to the second substrate working table, and the control unit determines whether or not the respective substrate working tables interfere with each other based on the position information related to the respective substrate working tables and an interval between the two substrate recognition cameras in the specific direction by causing the first indicator of the first substrate working table to be imaged by the first substrate recognition camera and causing the second indicator of the second substrate working table to be imaged by the second substrate recognition camera.

With this configuration, it is not necessary to move the respective substrate working tables to a position of a common (single) substrate recognition camera, as in the case of recognizing an indicator of each of the respective substrate working tables with a single substrate recognition camera. Therefore, it is possible to acquire the position information related to the respective substrate working tables more easily and promptly.

In the substrate working device according to the one aspect, it may be such that a printing work unit that prints, via a mask, solder with respect to the substrate held by the first substrate working table and the second substrate working table is further provided, the imaging unit is a first mask recognition camera provided to the first substrate working table and a second mask recognition camera provided to the second substrate working table for recognition of the mask, and the indicator is provided to the base side member in a position where imaging is possible by the two mask recognition cameras.

With this configuration, it is possible to provide a substrate working device (printing device) that performs solder printing on a substrate, wherein an accurate determination on whether or not the substrate working tables mutually interfere at the time of movement is possible. Since the position information related to the first substrate working table and the second substrate working table can be acquired using the mask recognition camera for recognizing the mask, it is possible to accurately determine whether or not the substrate working tables mutually interfere at the time of movement, without causing complications in the device configuration by separately providing a dedicated imaging unit to acquire the position information related to the substrate working table.

In the substrate working device, it may be such that the indicator includes a first indicator provided in a position where imaging is possible by the first mask recognition camera and a second indicator provided in a position where imaging is possible by the second mask recognition camera, and the control unit determines whether or not the respective substrate working tables interfere with each other based on the position information related to the respective substrate working tables obtained by causing the first mask recognition camera to image the first indicator and causing the second mask recognition camera to image the second indicator and an interval between the two indicators in the specific direction.

With this configuration, it is not necessary to move the respective substrate working tables to a position of a common (single) indicator, as in the case of recognizing a single indicator with a mask substrate recognition camera of the respective substrate working tables. Therefore, it is possible to acquire the position information related to the respective substrate working tables more easily and promptly.

In the substrate working device according to the one aspect, the indicator is preferably a mark for position recognition.

With this configuration, it is possible to perform image recognition of the indicator more reliably and precisely, compared to a case of, for example, performing image recognition with a predetermined segment within a device as an indication (indicator).

INDUSTRIAL APPLICABILITY

As described above, the substrate working device of the present disclosure is capable of accurately determining whether or not two substrate working tables mutually interfere, and thus is useful in the manufacturing field of a printing device, surface mounting machine, inspection device, or the like in which work proceeds in a state where a substrate is held by two substrate working tables movable in a direction to approach each other.

The invention claimed is:
1. A substrate working device that performs predetermined work with respect to a substrate, comprising:
   a base;
   a first substrate working table and a second substrate working table movably supported on the base to be able to approach each other in a specific direction;
   an indicator provided on one of a base side member, which is the base or a member fixed to the base, and the first and second substrate working tables;

an imaging unit provided on the other one, which is different from the one, of the base side member and the first and second substrate working tables in order to image the indicator; and a control unit that, by causing the imaging unit to image the indicator and based on image data thereof and position data of one of the indicator and the imaging unit, the one which is provided to the base side member, acquires position information related to each of the substrate working tables, and that moreover determines whether or not the respective substrate working tables interfere with each other at a time of movement of each of the substrate working tables based on the position information.

2. The substrate working device according to claim 1, wherein the position information is a position coordinate of the first substrate working table and the second substrate working table.

3. The substrate working device according to claim 2, wherein the control unit calculates, based on the position coordinate of the first substrate working table and the second substrate working table and a minimum interval between the two substrate working tables enabled to approach to each other in the specific direction without interference with each other, an interference reference distance that is a sum of moving distances of the respective substrate working tables when the respective substrate working tables are caused to approach up to a position of the minimum interval from a predetermined origin position, and moreover determines whether or not the substrate working tables interfere with each other by comparing a moving target coordinate or current coordinate of the two substrate working tables and the interference reference distance.

4. The substrate working device according to claim 1, wherein the control unit performs control of repeatedly acquiring the position information by causing the imaging unit to image the indicator at a predetermined timing during the predetermined work.

5. The substrate working device according to claim 1, wherein the imaging unit is a substrate recognition camera that is provided in a fixed manner to the base side member and that recognizes the substrate held by the first substrate working table, and the second substrate working table, and the indicator includes a first indicator provided to the first substrate working table in a position where imaging is possible by the substrate recognition camera and a second indicator provided to the second substrate working table in a position where imaging is possible by the substrate recognition camera.

6. The substrate working device according to claim 5, wherein the substrate recognition camera includes a first substrate recognition camera corresponding to the first substrate working table and a second substrate recognition camera corresponding to the second substrate working table, and the control unit determines whether or not the respective substrate working tables interfere with each other based on the position information related to the respective substrate working tables and an interval between the two substrate recognition cameras in the specific direction by causing the first indicator of the first substrate working table to be imaged by the first substrate recognition camera and causing the second indicator of the second substrate working table to be imaged by the second substrate recognition camera.

7. The substrate working device according to claim 1, further comprising a printing work unit that prints, via a mask, solder with respect to the substrate held by the first substrate working table and the second substrate working table, wherein the imaging unit is a first mask recognition camera provided to the first substrate working table, and a second mask recognition camera provided to the second substrate working table for recognition of the mask, and the indicator is provided to the base side member in a position where imaging is possible by the two mask recognition cameras.

8. The substrate working device according to claim 7, wherein the indicator includes a first indicator provided in a position where imaging is possible by the first mask recognition camera and a second indicator provided in a position where imaging is possible by the second mask recognition camera, and the control unit determines whether or not the respective substrate working tables interfere with each other based on the position information related to the respective substrate working tables obtained by causing the first mask recognition camera to image the first indicator and causing the second mask recognition camera to image the second indicator and an interval between the two indicators in the specific direction.

9. The substrate working device according to claim 1, wherein the indicator is a mark for position recognition.

* * * * *